(12) United States Patent
Yoshitomi

(10) Patent No.: US 11,742,413 B2
(45) Date of Patent: Aug. 29, 2023

(54) METHOD OF MANUFACTURING SEMICONDUCTOR DEVICE

(71) Applicant: RENESAS ELECTRONICS CORPORATION, Tokyo (JP)

(72) Inventor: Atsushi Yoshitomi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 262 days.

(21) Appl. No.: 17/190,891

(22) Filed: Mar. 3, 2021

(65) Prior Publication Data
US 2021/0336039 A1 Oct. 28, 2021

(30) Foreign Application Priority Data

Apr. 28, 2020 (JP) ................. 2020-078767

(51) Int. Cl.
*H01L 29/66* (2006.01)
*H10B 43/35* (2023.01)

(52) U.S. Cl.
CPC .. *H01L 29/66795* (2013.01); *H01L 29/66833* (2013.01); *H10B 43/35* (2023.02)

(58) Field of Classification Search
CPC ........... H01L 29/66795; H01L 27/1157; H01L 29/66833
See application file for complete search history.

(56) References Cited

U.S. PATENT DOCUMENTS

| | | | |
|---|---|---|---|
| 6,037,209 A * | 3/2000 | Rosner | H01L 27/10823 |
| | | | 257/E21.655 |
| 9,870,942 B1 | 1/2018 | Wu et al. | |
| 10,062,584 B1 | 8/2018 | Chen et al. | |
| 10,600,799 B2 | 3/2020 | Tsuda et al. | |
| 2008/0111162 A1 | 5/2008 | Yang et al. | |
| 2013/0037871 A1 | 2/2013 | Sudo | |
| 2013/0115777 A1 | 5/2013 | Tung et al. | |
| 2014/0024209 A1* | 1/2014 | Jung | H01L 21/32139 |
| | | | 257/E21.19 |
| 2016/0118500 A1 | 4/2016 | Wu et al. | |

FOREIGN PATENT DOCUMENTS

JP 2017-123398 A 7/2017

OTHER PUBLICATIONS

Partial European Search Report issued in corresponding European Patent Application No. 21169357.7-1230, dated Sep. 23, 2021.

\* cited by examiner

*Primary Examiner* — Mohammad M Choudhry

(74) *Attorney, Agent, or Firm* — McDermott Will & Emery LLP

(57) ABSTRACT

Reliability and performance of a semiconductor device are improved. First, a first mask pattern is formed on the semiconductor substrate in each of first to third regions. Next, a second mask pattern made of a material that is different from a material configuring the first mask pattern is formed on a side surface of the first mask pattern and on the semiconductor substrate in each of the first to third regions. Next, by an anisotropic etching process performed to the semiconductor substrate, a plurality of fins protruding from the recessed upper surface of the semiconductor substrate are formed. In the manner, fins each having a different structure from that of a fin in the first region can be formed in the second and third regions.

17 Claims, 22 Drawing Sheets

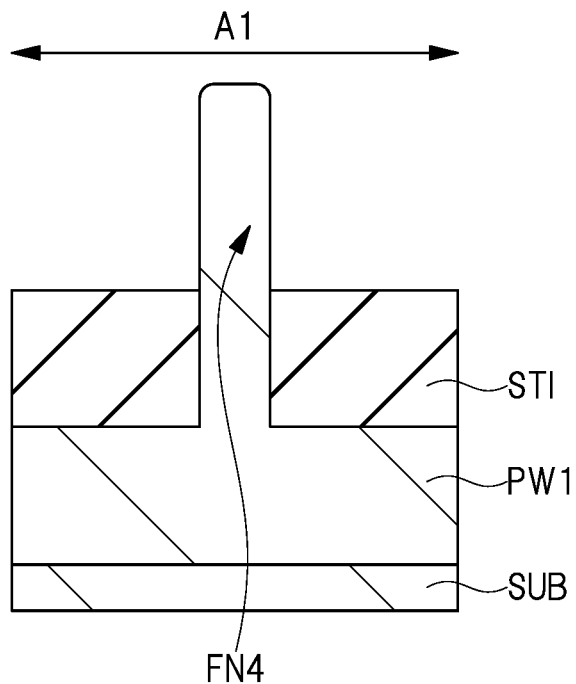
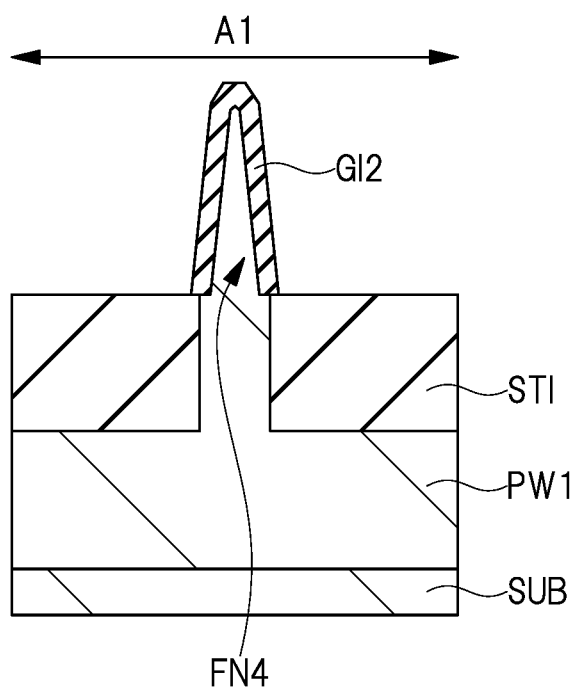

METHOD OF MANUFACTURING SEMICONDUCTOR DEVICE

CROSS-REFERENCE TO RELATED APPLICATION

The disclosure of Japanese Patent Application No. 2020-078767 filed on Apr. 28, 2020, including the specification, drawings and abstract is incorporated herein by reference in its entirety.

BACKGROUND

The present invention relates to a method of manufacturing a semiconductor device, and, more particularly related to a method of manufacturing a semiconductor device including a fin-structural transistor.

A fin-structural transistor (FinFET: Fin Field Effect Transistor) is known as an electric field effect transistor that enables increase in an operational speed, decrease in a leakage electric current, decrease in power consumption and microfabrication of a semiconductor element. The FinFET is, for example, a semiconductor element including: a semiconductor layer serving as a channel region and protruding from a semiconductor substrate; and a gate electrode formed so as to straddle the protruding semiconductor layer.

A semiconductor device (semiconductor chip) includes semiconductor elements such as a low-voltage MISFET (Metal Insulator Semiconductor Field Effect Transistor) type, a high-voltage MISFET type and a MONOS (Metal Oxide Nitride Oxide Semiconductor type transistors. When these semiconductor elements are formed in a fin structure, the different fin structures of the respective semiconductor elements have been studied in order to obtain the suitable properties of the respective semiconductor elements.

There are disclosed techniques listed below.
[Patent Document 1] Japanese Unexamined Patent Application Publication No. 2017-123398

For example, the Patent Document 1 discloses a technique of forming, in a low-voltage MISFET region, a fin structure that is different from those of other regions by making difference between a resist pattern and an etching condition used for a low-voltage MISFET formation region and resist patterns and etching conditions used for other regions.

SUMMARY

The method of forming the different fin structures by making the difference in terms of the etching conditions disclosed in the Patent Document 1 is difficult to control a taper angle and a width of each fin, and further causes a concern about increase in variation of a shape of each fin inside the semiconductor device. Therefore, there is risks of decrease in responsibility and performance of the semiconductor device.

Other object and novel characteristics will be apparent from the description of the present specification and the accompanying drawings.

The summary of the typical aspects of the embodiments disclosed in the present application will be briefly described as follows.

A method of manufacturing a semiconductor device according to an embodiment includes: (a) a step of preparing a semiconductor substrate having a first region and a second region that is different from the first region; (b) a step of forming a first pattern on the semiconductor substrate in each of the first region and the second region; (c) a step of forming a second pattern, that is made of a different material from a material of the first pattern, on a side surface of the first pattern and on the semiconductor substrate in the first region and the second region; (d) a step of selectively removing the second pattern in the first region; (e) a step of, after the step (d), forming a first fin in the first region and a second fin in the second region by performing an anisotropic etching process to the semiconductor substrate in a state in which the first pattern is left on the semiconductor substrate in the first region while the first and the second patterns are left on the semiconductor substrate in the second region. In this case, after the step (e), the first fin protrudes from an upper surface of the semiconductor substrate adjacent to the first fin, and the second fin protrudes from an upper surface of the semiconductor substrate adjacent to the second fin.

A method of manufacturing a semiconductor device according to an embodiment includes: (a) a step of preparing a semiconductor substrate having a first region and a second region that is different from the first region; (b) a step of, by recessing a part of an upper surface of the semiconductor substrate, forming a first fin in the first region so that the first fin being a part of the semiconductor substrate protrudes from the recessed upper surface of the semiconductor substrate and extends in a first direction in a planar view, and forming a second fin in the second region so that the second fin being a part of the semiconductor substrate protrudes from the recessed upper surface of the semiconductor substrate and extends in a third direction in a planar view; (c) a step of, after the step (b), forming a first insulating film on upper and side surfaces of the first fin in the first region and on upper and side surfaces of the second fin in the second region; (d) a step of, after the step (c), selectively removing the first insulating film in the second region; (e) a step of, after the step (d), forming a second gate insulating film on the upper and the side surfaces of the second fin in the second region in a state in which the first insulating film in the first region is left; (f) a step of, after the step (e), removing the first insulating film in the first region; and (g) a step of, after the step (f), forming a first gate insulating film having a thickness that is smaller than that of the second gate insulating film, on the upper and the side surfaces of the first fin in the first region.

According to an embodiment, reliability of a semiconductor device can be improved. And, performance of the semiconductor device can be improved.

BRIEF DESCRIPTIONS OF THE DRAWINGS

FIG. 2 is a cross-sectional view showing a method of manufacturing a semiconductor device according to a first study example.

FIG. 3 is a cross-sectional view showing the method of manufacturing the semiconductor device, continued from FIG. 2.

DETAILED DESCRIPTION

Figure 1:
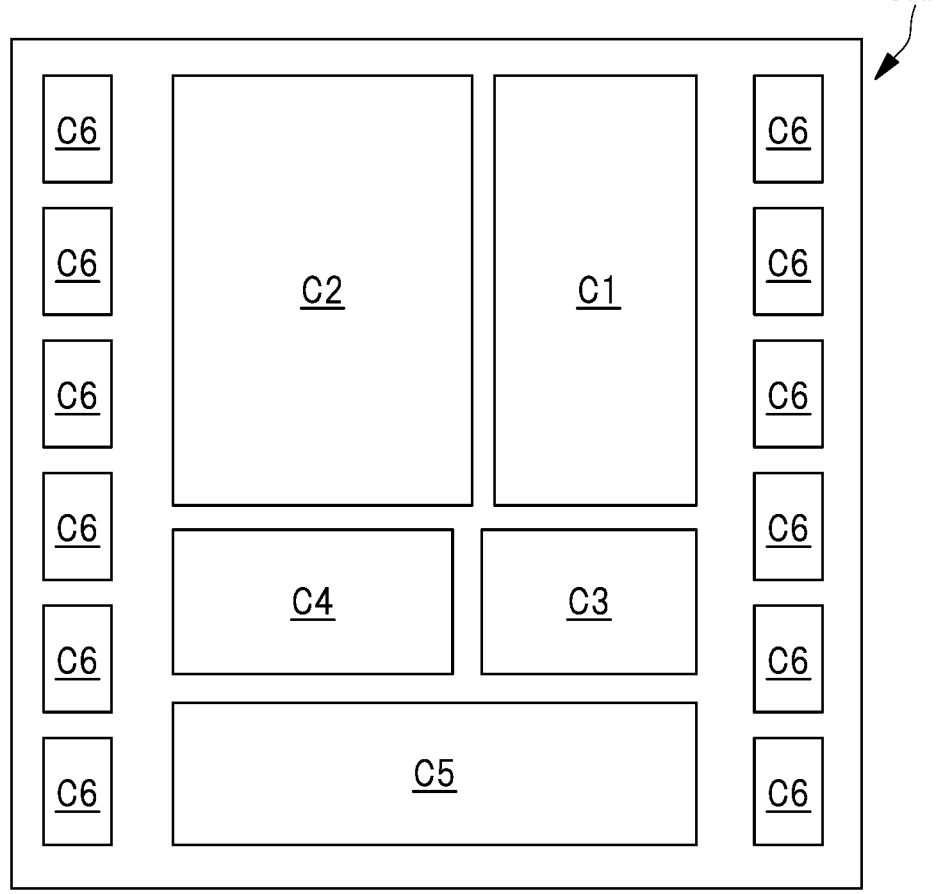
FIG. 1 is a schematic view showing a layout configuration of a semiconductor chip that is a semiconductor device according to a first embodiment.

Embodiments will be described in detail below on the basis of the accompanying drawings. In the drawing for use in describing the embodiments, the same reference symbols are attached to the same elements having the same function, and the repetitive description thereof will be omitted. In addition, the description of the same or similar portions is not repeated in principle unless particularly required in the following embodiments.

Further, in some drawings used in the embodiments, hatching is omitted so as to make the drawings easy to see.

an X direction, a Y direction and a Z direction described in the present application are orthogonal to one another. The present application describes the Z direction as an upper and lower direction of a certain structure or a height direction of the same in some cases. A plane made by the X direction and the Y direction has a flat surface that is vertical to the Z direction. For example, expression of "planar view" in the present application means that the plane made by the X direction and the Y direction is viewed in the Z direction.

First Embodiment

<Layout Configuration of Semiconductor Chip CHP>

First, with reference to FIG. 1, a layout configuration of a semiconductor chip CHP that is a semiconductor device according to a first embodiment will be explained.

The semiconductor chip CHP is provided with a plurality of circuit blocks for use in various different purposes. Specifically, the semiconductor chip CHP includes: a flash memory circuit block C1, an EEPROM (Electrically Erasable and Programmable Read Only Memory) circuit block C2, a CPU (Central Processing Unit) circuit block C3, a RAM (Random access Memory) circuit block C4, an analog circuit block C5 and an I/O (Input/Output) circuit block C6.

Each of the flash memory circuit block C1 and the EEPROM circuit block C2 is a region serving as a semiconductor element which includes a non-volatile memory cell or others, storage information of which is electrically rewritable, and in which, for example, a MONOS transistor is formed. A positive or a negative voltage of about 10 V is used for the rewriting of the storage information. The flash memory circuit block C1 and the EEPROM circuit block C2 are used for different purposes from each other.

For example, for a computer readable storage medium operating the following CPU circuit block C3, a high reading speed for the computer readable storage medium is needed although a frequency of the rewriting is less. For storage of such a computer readable storage medium, the non-volatile memory cell of the flash memory circuit block C1 is used. For data used in the CPU circuit block C3, the high reading speed is not needed so much although resistance to the rewriting is needed since the frequency of the rewriting is high. For storage of such data, the non-volatile memory cell of the EEPROM circuit block C2 is used.

The CPU circuit block C3 includes a logic circuit driven by a voltage of about 1 V, and is a region serving as a semiconductor element in which a low-voltage MISFET having a low breakdown voltage and a high speed operation is formed.

The RAM circuit block C4 is a region which includes an SRAM (Static RAM) and in which a low-voltage MISFET having a cross-sectional structure that is almost the same as that of the CPU circuit block C3 is formed as a semiconductor element.

The analog circuit block C5 is a region which includes an analog circuit and in which a capacitance element, a resistor element, a bipolar transistor, a high-voltage MISFET having a higher breakdown voltage than that of the low-voltage MISFET and driven by a voltage of about 5 V, and others are formed as a semiconductor element.

The I/O circuit block C6 is a region which includes an input/output circuit and in which a high-voltage MISFET having a cross-sectional structure that is almost the same as that of the analog circuit block C5 is formed as a semiconductor element.

In cross-sectional views used for the following explanations, note that the formation region of the low-voltage MISFET is assumed to a region A1, the formation region of the high-voltage MISFET is assumed to a region A2 and the formation region of the non-volatile memory cell is assumed to a region A3.

Before the explanation for the method of manufacturing of the semiconductor device according to the first embodiment, semiconductor devices according to first and second study examples studied by the present inventor will be explained, and issues that have been newly found from the studies will be explained.

Regarding First Study Example

Each of FIGS. 2 and 3 shows a cross-sectional view of the low-voltage MISFET in a gate-width direction.

As shown in FIG. 2, in the region A1, a fin FN4 that is a protrusion (convex portion) selectively protruding from an upper surface of a semiconductor substrate SUB is formed. In the semiconductor substrate SUB including the fin FN4, a p-type well region PW1 is formed. An element isolation portion STI is made of, for example, a silicon oxide film, and a position of an upper surface of the element isolation portion STI is lower than a position of an upper surface of the fin FN4. A partial surface of the fin FN4, the partial surface protruding from the upper surface of the element isolation portion STI, becomes a channel region of the low-voltage MISFET.

As shown in FIG. 3, before formation of a gate insulating film of the low-voltage MISFET, a step of forming a gate insulating film GI2 of the high-voltage MISFET is performed by a thermal oxidation method. The gate insulating film GI2 has a sufficiently larger thickness than that of the gate insulating film of the low-voltage MISFET. In this process, the gate insulating film GI2 is also formed on upper and side surfaces of the fin FN4 in the region A1. Then, the gate insulating film GI2 in the region A2 is removed by solution containing hydrofluoric acid or others.

In this process, the gate insulating film GI2 is formed by reaction with a material configuring the fin FN4. Therefore, when a width of the fin FN4 is small, an end of the fin FN4 is thinned or lost in some cases. In this case, the channel region of the low-voltage MISFET becomes small, and there is a problem of decrease in a performance of the low-voltage MISFET, such as decrease in an electric current amount.

Therefore, for the step of forming the gate insulating film GI2 of the high-voltage MISFET, there is need of a technique capable of securing the width of the fin FN4 in the region A1 where the low-voltage MISFET is formed.

Regarding Second Study Example

Figure 4:
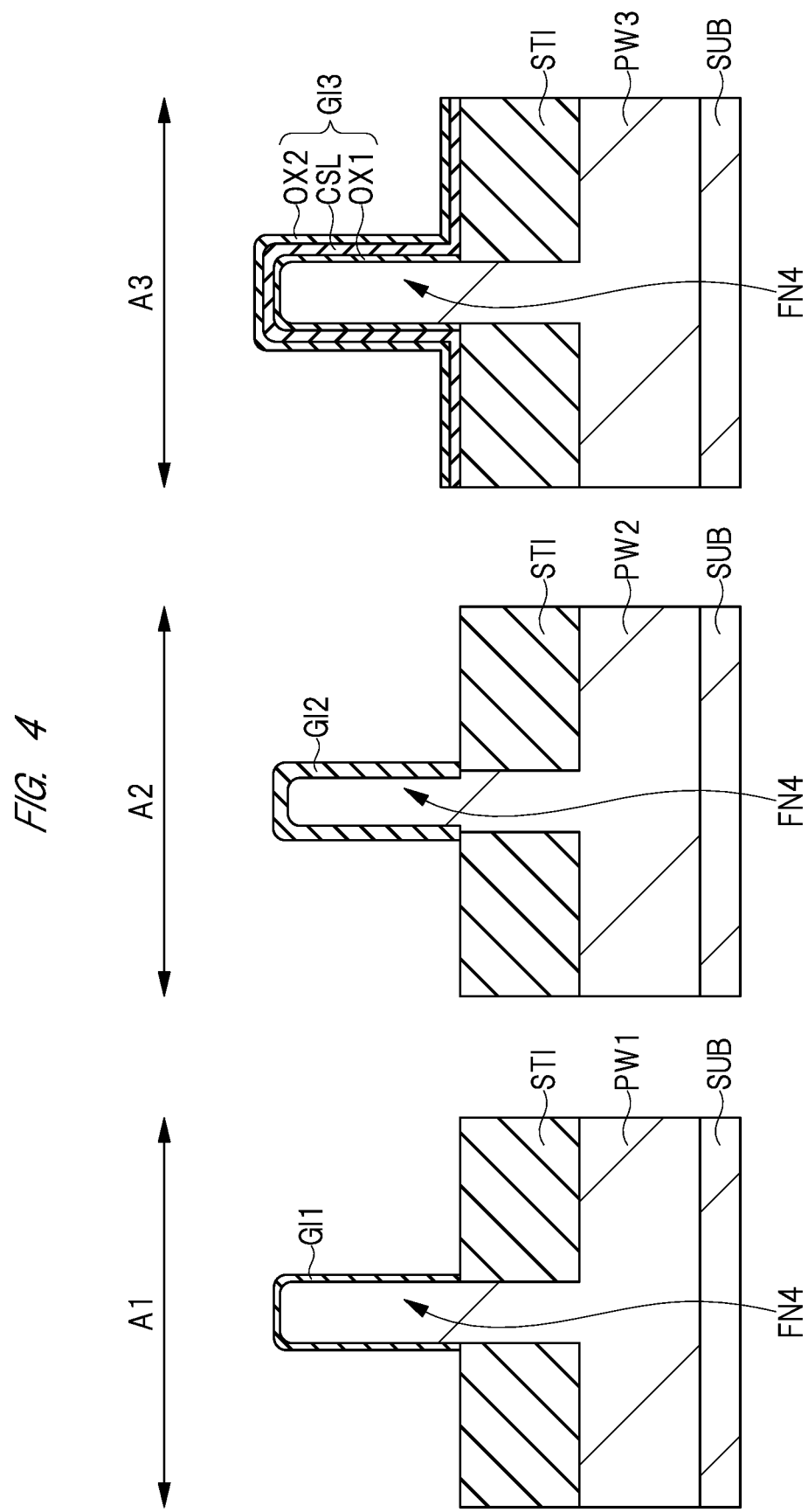
FIG. 4 is cross-sectional views each showing a semiconductor device according to a second study example.

The second study example has a different problem from the first study example. FIG. 4 shows cross-sectional views of the low-voltage MISFET formed in the region A1, the high-voltage MISFET formed in the region A2 and the non-volatile memory cell formed in the region A3 in respective gate-width directions.

As shown in FIG. 4, well regions PW1 to PW3 are formed in the semiconductor substrate SUB in the regions A1 to A3, respectively, gate insulating films GI1 to GI3 are formed in the fins FN4, respectively, and gate electrodes GE1 to GE3 are formed on the gate insulating films GI1 to GI3, respectively. Note that the gate insulating film GI3 of the non-volatile memory cell is made of a layered film of an insulating film OX1, an electrical-charge accumulating layer CSL and an insulating film OX2.

For the high-voltage MISFET and the non-volatile memory cell, a higher voltage than that of the low-voltage MISFET is used. Therefore, if the respective fins FN4 of the regions A1 to A3 are designed to be fitted with the property of the low-voltage MISFET and have the same width as one another, the electric field tends to concentrate on upper portions of the fins FN4 of the regions A2 and A3. As a result, there are problems of decrease in the breakdown voltages of the gate insulating films GI2 and GI3 and decrease in reliabilities of the high-voltage MISFET and the non-volatile memory cell.

On the other hand, if the respective fins FN4 of the regions A1 to A3 are designed be fitted with the properties of the high-voltage MISFET and the non-volatile memory cell, the width of the fin FN4 of the low-voltage MISFET becomes large. Therefore, there is a problem of difficulty in achievement of the microfabrication of the low-voltage MISFET.

And, since the width of the fin FN4 is small, full depletion is caused in an upper portion of the fin FN4 at the time of the operation of the low-voltage MISFET. In this case, punch through phenomenon is easier to be caused between a source region and a drain region in the high-voltage MISFET and the non-volatile memory cell driven by a high voltage than the low-voltage MISFET, and therefore, the breakdown voltages of the high-voltage MISFET and the non-volatile memory cell are deteriorated.

Therefore, there is need of a technique capable of securing the reliabilities of the low-voltage MISFET, the high-voltage MISFET and the non-volatile memory cell by making the difference among the fin structures of the regions A1 to A3 so that the suitable properties can be obtained.

Outline of Fin of First Embodiment

Figure 5:
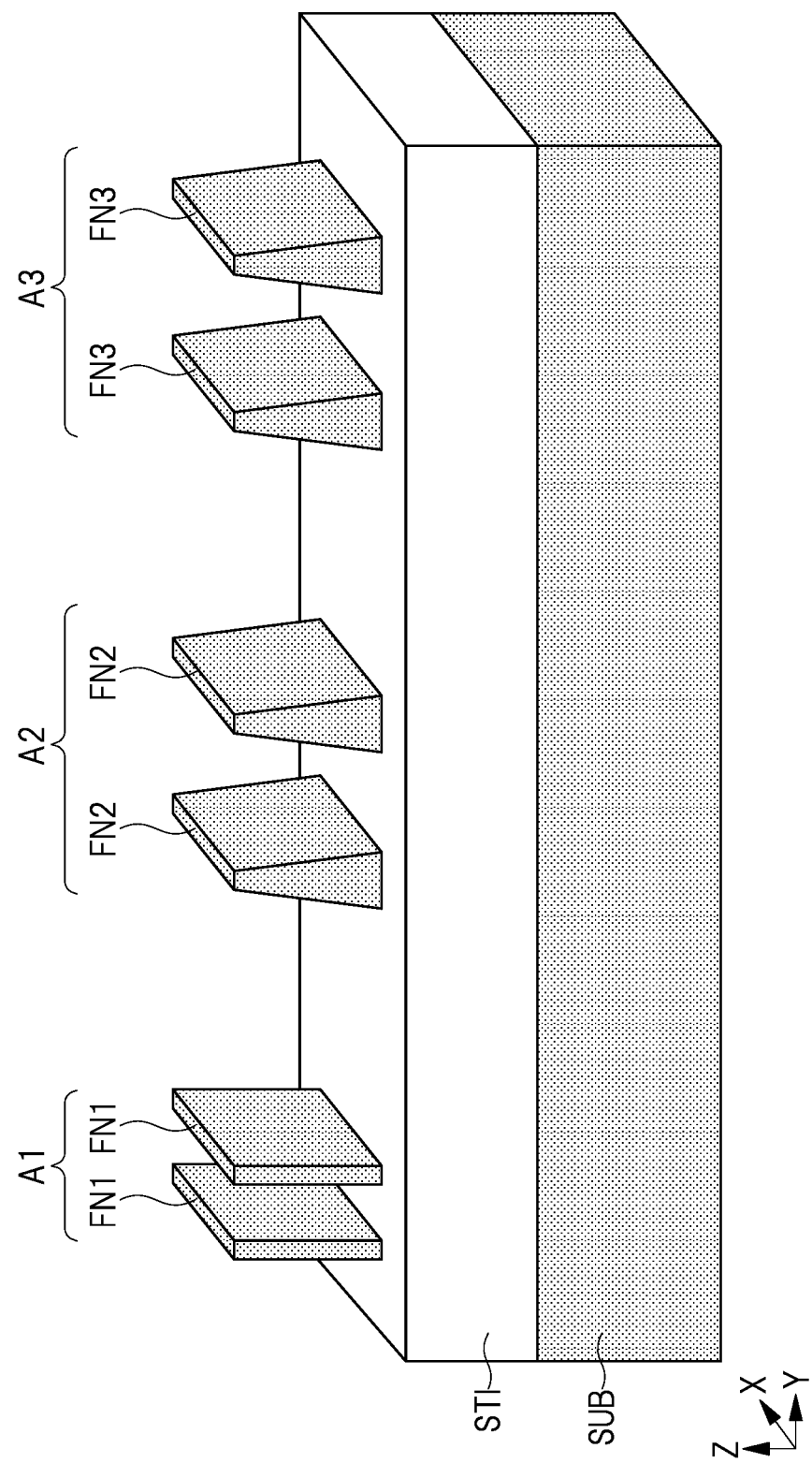
FIG. 5 is a perspective view showing an outline of a fin according to the first embodiment.
Figure 6:
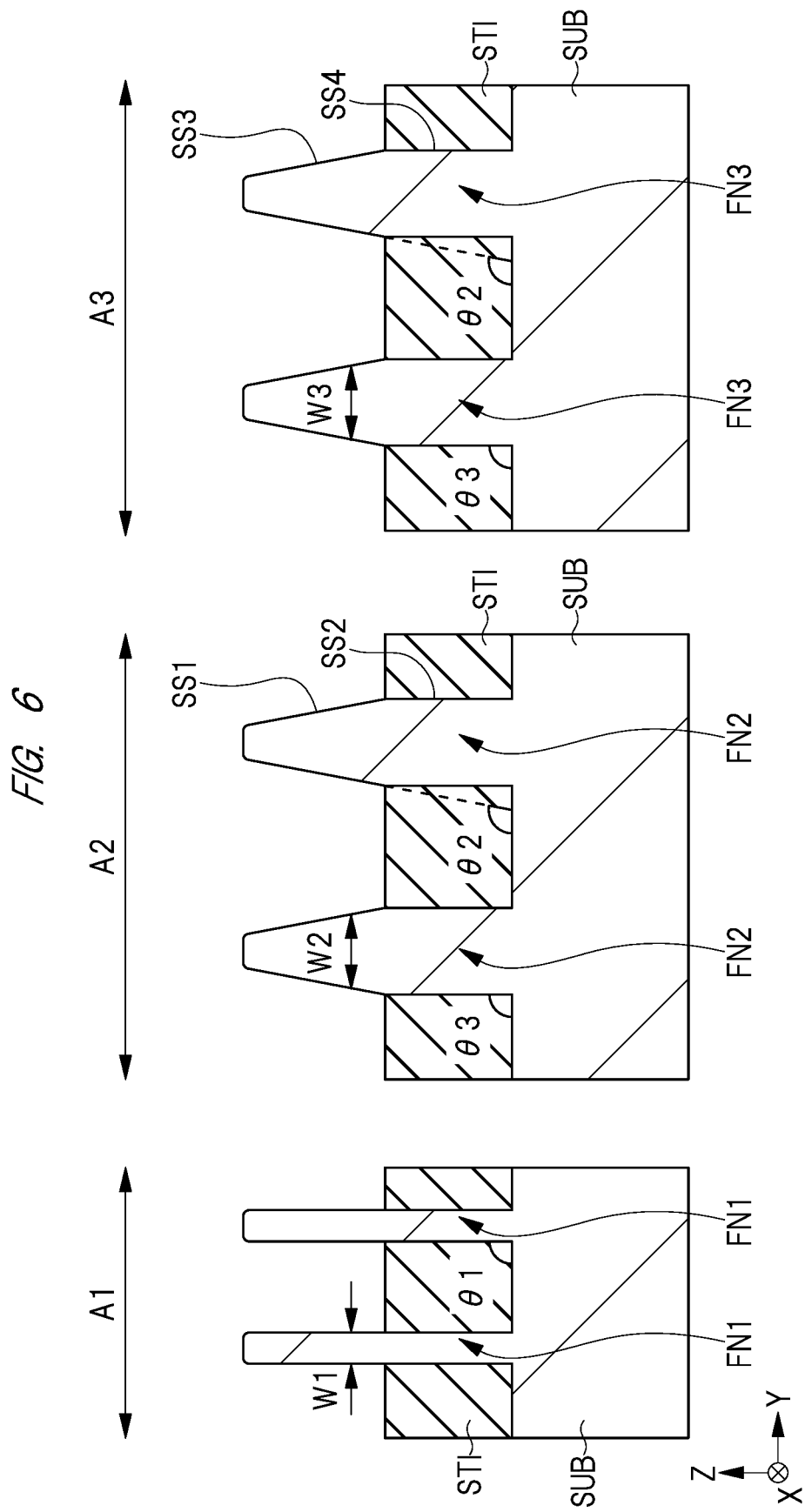
FIG. 6 is cross-sectional views each showing the outline of the fin according to the first embodiment.

First, with reference to FIGS. 5 and 6, an outline of fins FN1 to FN3 according to the first embodiment will be explained. FIG. 5 is a perspective view of the fins. FIG. 6 is cross-sectional views of enlarged principal parts of FIG. 5, and cross-sectional views of the low-voltage MISFET formed in the region A1, the high-voltage MISFET formed in the region A2 and the non-volatile memory cell formed in the region A3, in the respective gate-width directions.

Note that each of the low-voltage MISFET, the high-voltage MISFET and the non-volatile memory cell according to the first embodiment is an n-type transistor. P-type transistors are also formed in the semiconductor device (semiconductor chip CHP), but explanation for them is omitted here.

As shown in FIG. 5, the semiconductor device is provided with a plurality of fins that are formed by selectively recessing a part of the semiconductor substrate SUB. In the first embodiment, the fins FN1 to FN3 formed in the regions A1 to A3 are exemplified as the plurality of fins. Each of the fins FN1 to FN3 is a protrusion (convex portion) that is a part of the semiconductor substrate SUB, extends in the X direction and selectively protrudes in the Z direction from the upper surface of the semiconductor substrate SUB adjacent to each of the fins FN1 to FN3.

In FIG. 5, note that a case of the fins FN1 to FN3 extending in the X direction is exemplified. However, the extending directions of the fins FN1 to FN3 may be the Y direction or a different direction. Alternatively, the extending directions of the fins FN1 to FN3 may be different from one another.

As shown in FIG. 6, the element isolation portion STI is formed on each upper surface of the semiconductor substrate SUB between the fins FN1 to FN3 adjacent to one another. The position of the upper surface of the element isolation portion STI is lower than the position of each upper surface of the fins FN1 to FN3. In other words, a part of each of the fins FN1 to FN3 protrudes from the element isolation portion STI. In the first embodiment, a higher portion of each of the fins FN1 to FN3 than the upper surface of the element isolation portion STI is referred to as an upper portion of each of the fins FN1 to FN3, and a lower portion of each of the fins FN1 to FN3 than the upper surface of the element isolation portion STI is referred to as a lower portion of each of the fins FN1 to FN3 in some cases.

A region of the semiconductor substrate SUB, the region being defined by the element isolation portion STI, becomes an active region. That is, the upper portions of the fins FN1 to FN3 become active regions in each of which a channel region, a source region and a drain region of each of the low-voltage MISFET, the high-voltage MISFET and the non-volatile memory cell are formed.

In each of the regions A1 to A3, the upper surface of the element isolation portion STI is not constantly flat but may be varied in some cases. For example, between two fins, the upper surface of the element isolation portion STI is slightly higher as closer to the fins in some cases. In the first embodiment, in order to clearly explain the positions of the varying upper surfaces of the element isolation portion STI, "the position of the upper surface of the element isolation portion STI" is assumed at the lowest surface of the upper surfaces of the element isolation portion STI formed between the two fins.

Each upper surface of the fins FN1 to FN3 is not constantly flat but may be rounded in some cases. A side surface of the fin has a tilt angle that is vertical or nearly vertical to the upper surface of the semiconductor substrate USB as seen in the fin FN1 in some cases. However, the side surface of the fin tilts with respect to the upper surface of the semiconductor substrate SUB as seen in the fin FN2 or FN3 in some cases.

Each of the fins FN1 to FN3 has a head portion at the highest position of each of the fins FN1 to FN3 and a side portion positioned between the head portion of each of the fins FN1 to FN3 and the upper surface of the semiconductor substrate SUB. In the present first embodiment, each upper surface of the fins FN1 to FN3 means a surface including the head portion and a periphery of the head portion, and each side surface of the fins FN1 to FN3 means a surface including the side portion and a periphery of the side portion.

As main features of the structure of the semiconductor device according to the first embodiment, angles $\theta 1$ to $\theta 3$ that are the tilt angles of the respective side surfaces of the fins SN1 to FN3 and respective widths W1 to W3 of the fins FN1 to FN3 are exemplified.

Each of the angles $\theta 1$ to $\theta 3$ shown in FIG. 6 is an angle made by each side surface of the fins FN1 to FN3 and the upper surface of the semiconductor substrate SUB (a base surface of the element isolation portion STI) adjacent to each of the fins FN1 to FN3 in the Y direction.

The side surface of the fin FN1 makes the angle $\theta 1$ with respect to the upper surface of the semiconductor substrate SUB. The side surface of the fin FN2 has a first surface SS1 in an upper portion of the fin FN2 and a second surface SS2 in a lower portion of the fin FN2. The first surface SS1 makes the angle $\theta 2$ with respect to the upper surface of the semiconductor substrate SUB. The second surface SS2 is positioned to be lower than the first surface SS1, and makes the angle $\theta 3$ with respect to the upper surface of the semiconductor substrate SUB.

The side surface of the fin FN3 includes a third surface SS3 in an upper portion of the fin FN3 and a fourth surface SS4 in a lower portion of the fin FN3. The third surface SS3 makes the angle $\theta 2$ with respect to the upper surface of the semiconductor substrate SUB, and the fourth surface SS4 is positioned to be lower than the third surface SS3 and makes the angle $\theta 3$ with respect to the upper surface of the semiconductor substrate SUB.

The angle $\theta 1$ is, for example, equal to or larger than 90 degrees and smaller than 100 degrees. The angle $\theta 2$ is an obtuse angle, and is larger than the angle $\theta 1$ or the angle $\theta 3$, and is, for example, equal to or larger than 100 degrees and equal to or smaller than 120 degrees. The angle $\theta 3$ is the same as the angle $\theta 1$, and is, for example, equal to or larger than 90 degrees and smaller than 100 degrees.

The widths W1 to W3 shown in FIG. 6 are the widths of the fins FN1 to FN3 in the Y direction, respectively. Each of the width W2 and W3 is different from the width W1 and is larger than the width W1. More specifically, each of the widths W1 to W3 is an average width among different heights in each of the fins FN1 to FN3. For example, each of the width W2 and W3 is different from the width W1 and is larger than the width W1 at a certain height position of the upper portion of each of the fins FN1 to FN3 and at a certain height position of the lower portion of each of the fins FN1 to FN3.

The width W1 is, for example, equal to or larger than 10 nm and equal to or smaller than 20 nm, and each of the width W2 and W3 is, for example, equal to or larger than 10 nm and equal to or smaller than 60 nm.

Method of Manufacturing Semiconductor Device According First Embodiment

With reference to FIGS. 7 to 23, the method of manufacturing the semiconductor device including the fins FN1 to FN3 having the above-described structures will be explained below. The method of manufacturing the semiconductor device according to the presser first embodiment has been devised in consideration of each problem of the above-described first and second study examples. Each of FIGS. 7 to 22 is a cross-sectional view of each semiconductor element as similar to FIG. 6 in the gate-width direction, and FIG. 23 is a cross-sectional view of each semiconductor element in a gate-length direction.

Figure 7:
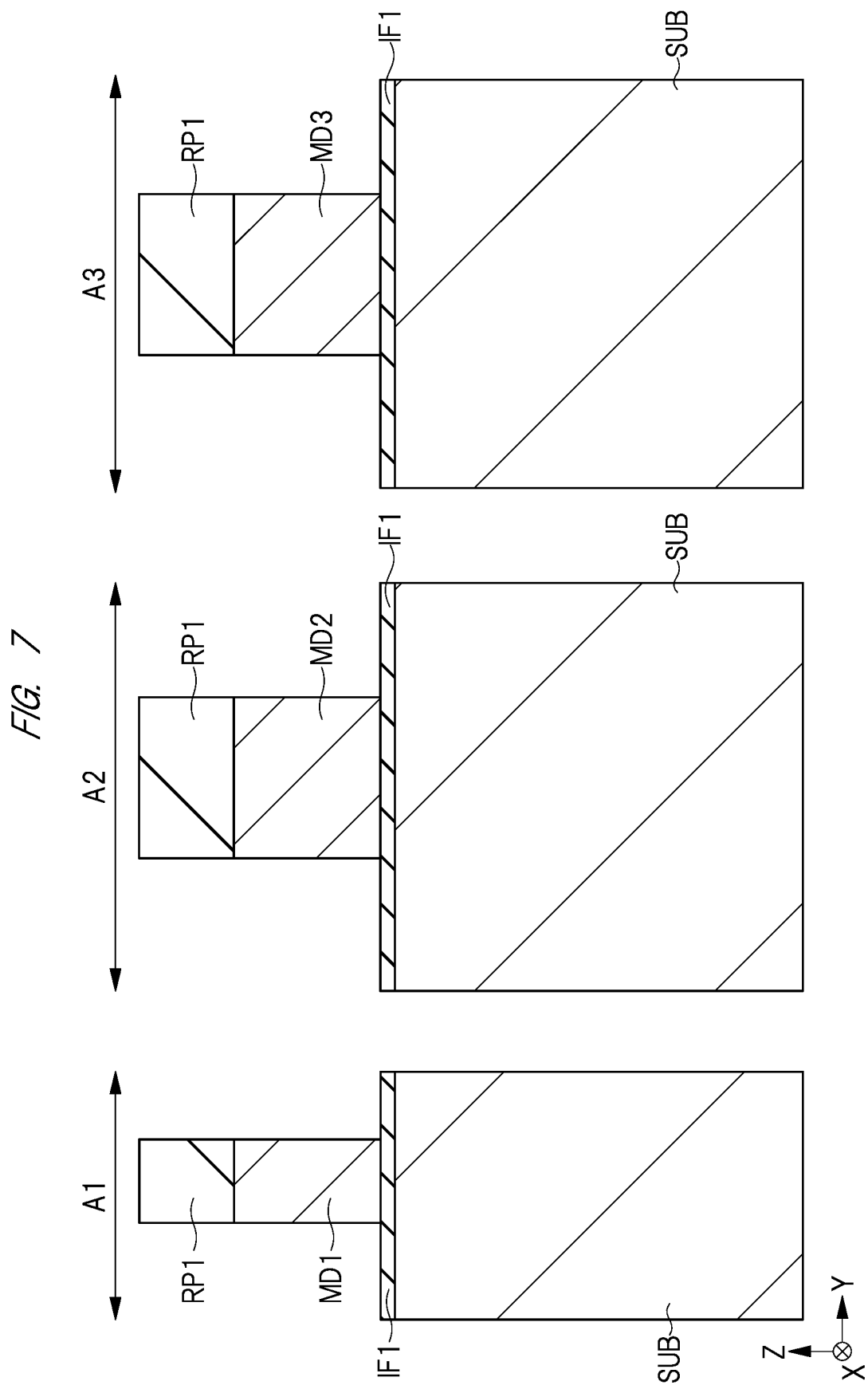
FIG. 7 is a cross-sectional view showing the method of manufacturing the semiconductor device according to the first embodiment.

First, as shown in FIG. 7, the semiconductor substrate SUB made of a p-type monocrystal silicon having a specific resistance of, for example, about 1 to 10 Ωcm is prepared. Next, on the semiconductor substrate SUB in each of the regions A1 to A3, an insulating film IF1 made of, for example, a silicon oxide film is formed by, for example, a thermal oxidation method or a CVD (Chemical Vapor Deposition) method.

Next, on the insulating film IF1 in each of the regions A1 to A3, a conductive film made of, for example, a polycrystal silicon film is formed by, for example, a CVD method. Next, on the conductive film in each of the regions A1 to A3, a resist pattern RP1 is formed. Next, an anisotropic etching process is performed while using the resist pattern RP1 as a mask to pattern the conductive film, so that each of mandrels MD1 to MD3 is formed on the insulating film IF1 in each of the regions A1 to A3. Then, the resist pattern RP1 is removed by an ashing process or others.

Figure 8:
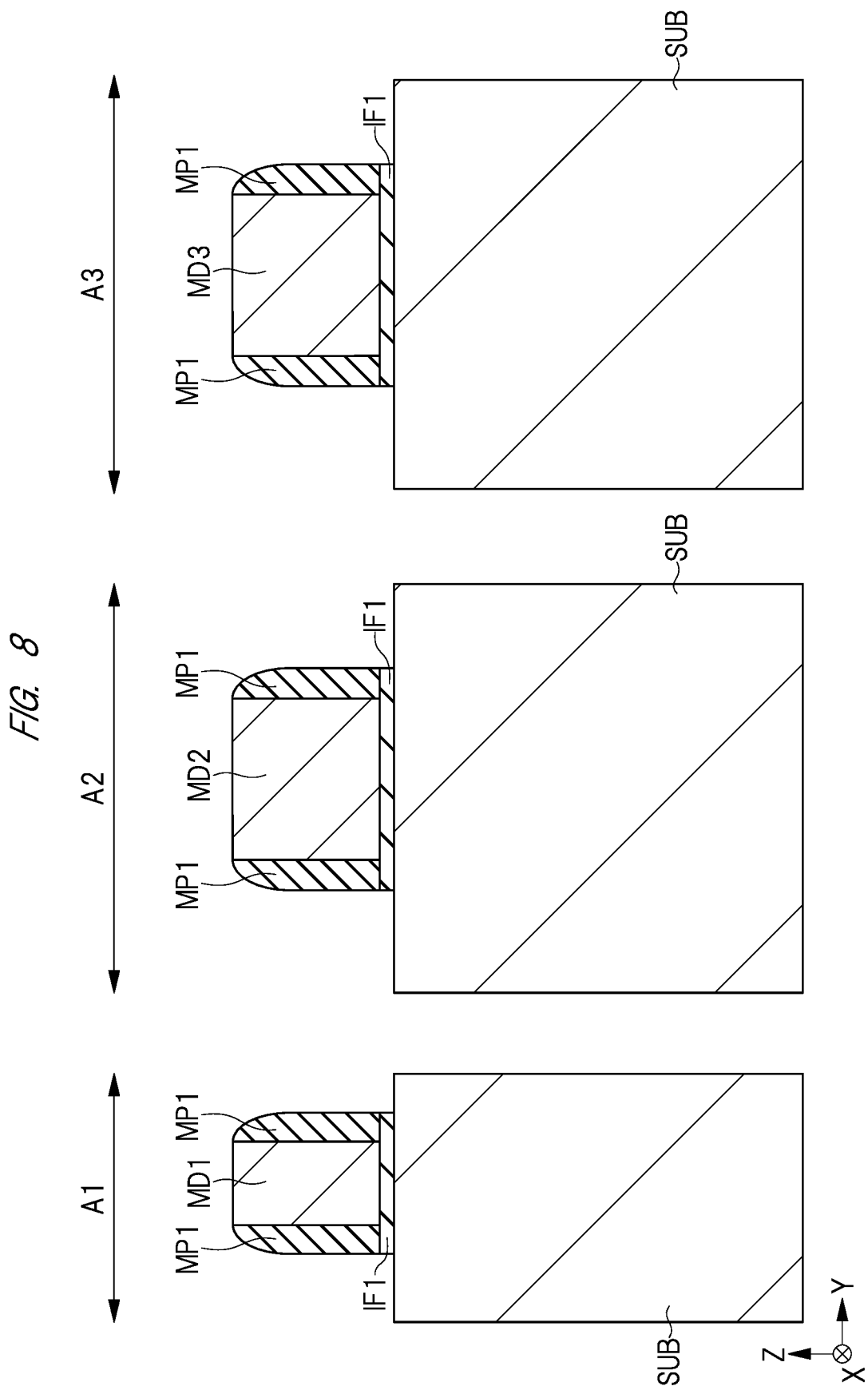
FIG. 8 is a cross-sectional view showing the method of manufacturing the semiconductor device, continued from FIG. 7.

FIG. 8 shows a step of forming a mask pattern MP1.

First, on the insulating film IF1, an insulating film made of, for example, a silicon oxide film is formed by, for example, a CVD method so as to cover each of the mandrels MD1 to MD3 in the regions A1 to A3. A material making this insulating film is different from materials making the mandrels MD1 to MD3 and a material making the semiconductor substrate SUB. A thickness of this insulating film is, for example, 10 to 20 nm.

Next, an anisotropic etching process is performed to this insulating film, so that the mask pattern (pattern) MP1 made of this insulating film is formed on a side surface of each of the mandrels MD1 to MD3 in the regions A1 to A3. In this step, the insulating film IF1 is removed from a surface not covered with the mandrels MD1 to MD3 and the mask pattern MP1, so that the semiconductor substrate SUB is exposed therefrom.

Figure 9:
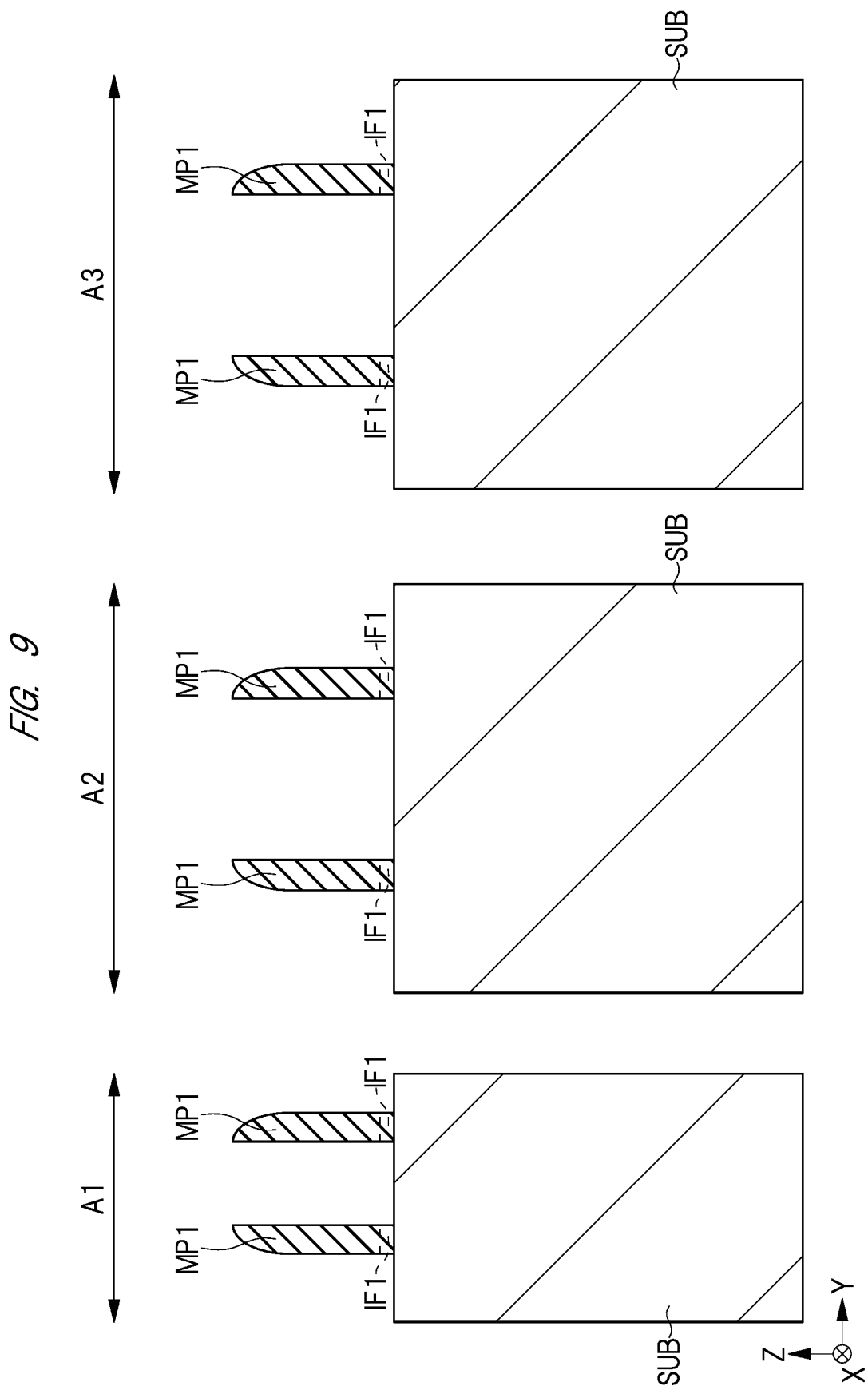
FIG. 9 is a cross-sectional view showing the method of manufacturing the semiconductor device, continued from FIG. 8.

FIG. 9 shows a step of removing the mandrels MD1 to MD3.

The mandrels MD1 to MD3 in the regions A1 to A3 are removed by an isotropic etching process. Next, the insulating film IF1 covered with each of the mandrels MD1 to MD3 is removed by an isotropic etching process. In this step, an upper portion of the mask pattern MP1 is also slightly etched. In this manner, the mask pattern MP1 is left on the substrate SUB in each of the regions A1 to A3.

Note that the insulating film IF1 below the mask pattern MP1 is left. Meanwhile, the material of the mask pattern MP1 and the material of the insulating film IF1 are the same as each other, and this mask pattern and this insulating film are formed to be unified, and therefore, only the mask pattern MP1 is illustrated for simplification of the following explanation.

Figure 10:
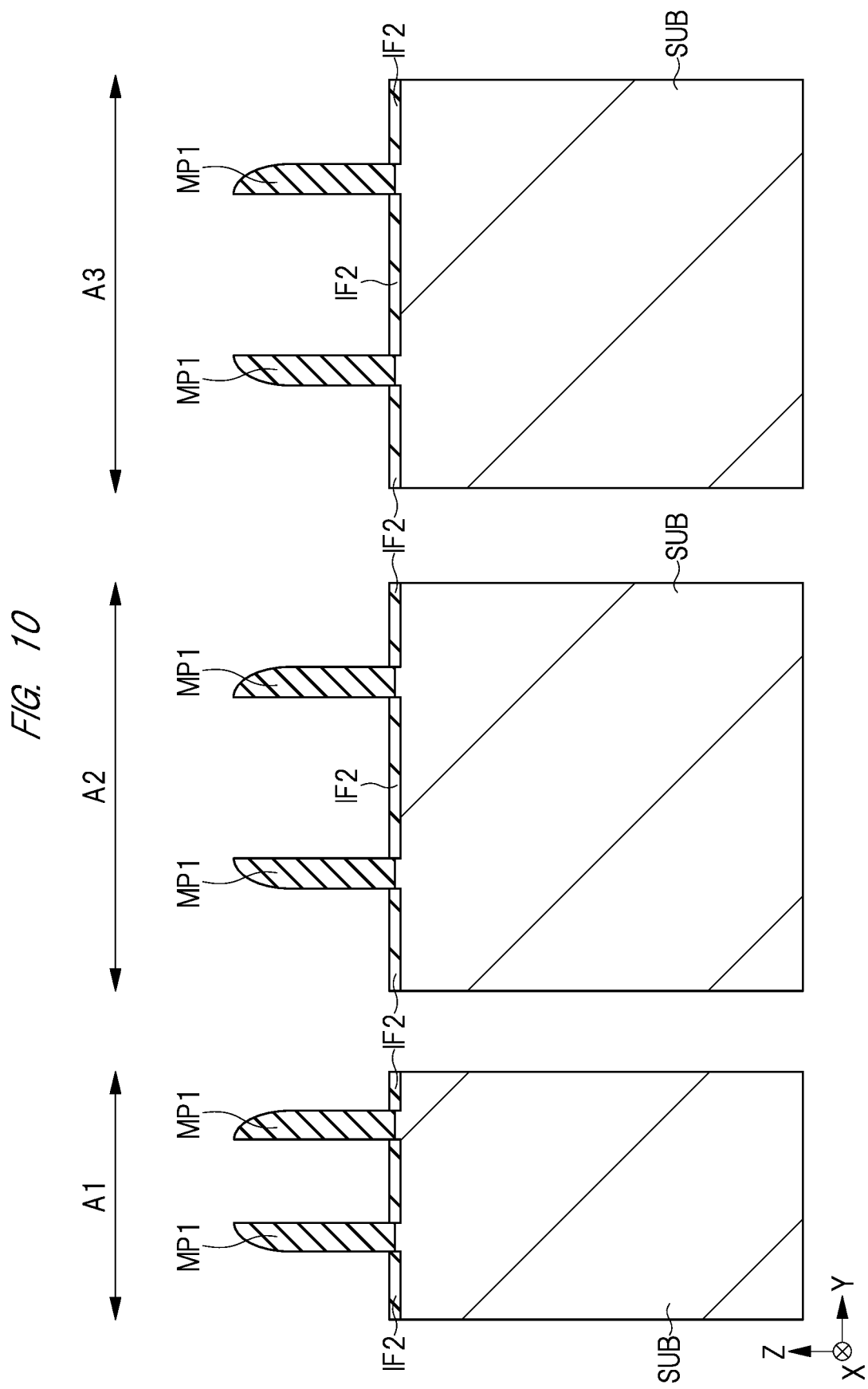
FIG. 10 is a cross-sectional view showing the method of manufacturing the semiconductor device, continued from FIG. 9.

FIG. 10 shows a step of forming an insulating film IF2.

On a part of the semiconductor substrate SUB exposed from the mask pattern MP1, the insulating film IF2 made of, for example, a silicon oxide film is formed by a thermal oxidation method. A thickness of this insulating film IF2 is, for example, 5 to 10 nm.

Figure 11:
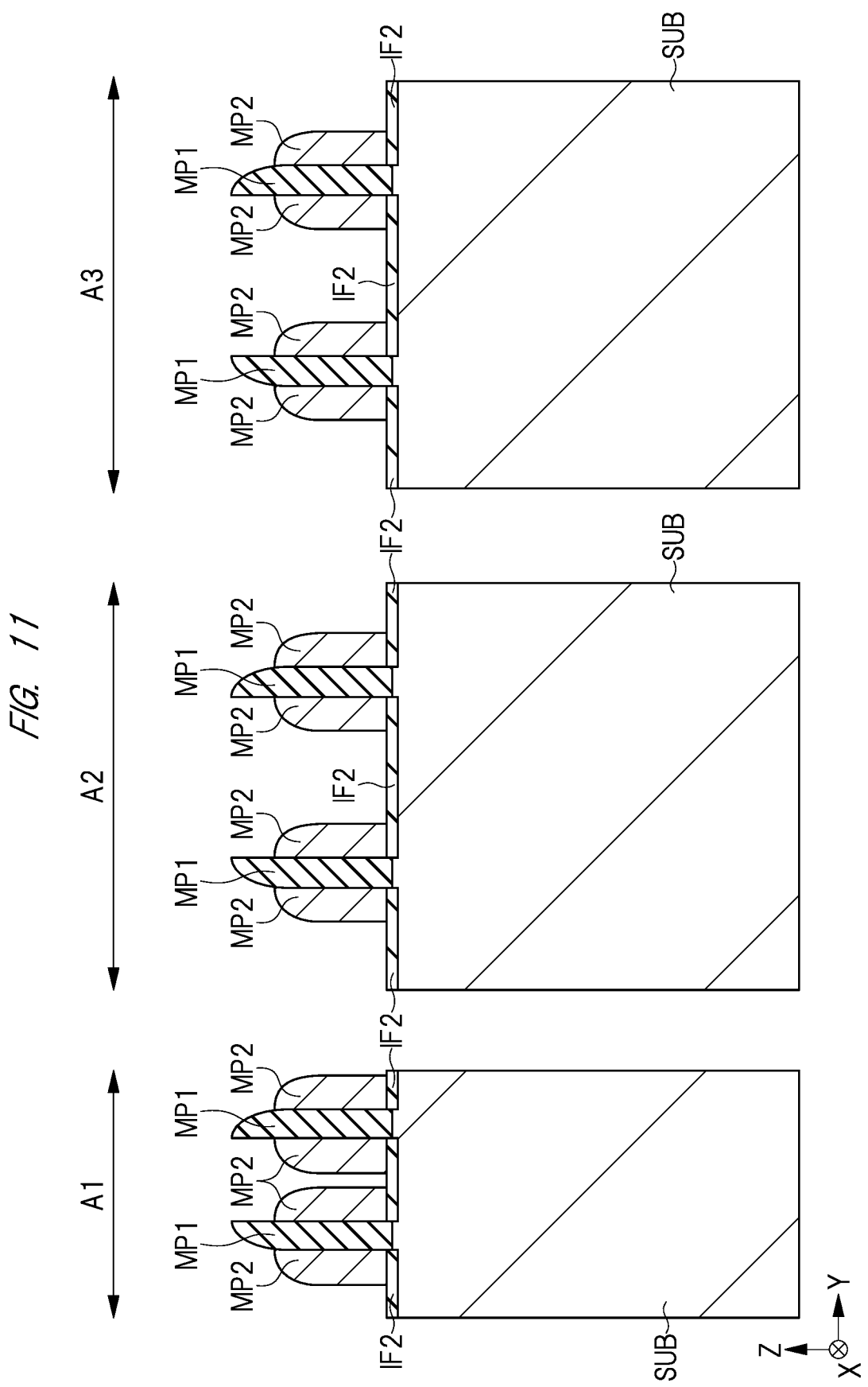
FIG. 11 is a cross-sectional view showing the method of manufacturing the semiconductor device, continued from FIG. 10.

FIG. 11 shows a step of forming a mask pattern MP2.

First, on the insulating film IF2, a conductive film made of, for example, a polycrystal silicon film (silicon film) is formed by, for example, a CVD method so as to cover the mask pattern MP1 in each of the regions A1 to A3. A thickness of this conductive film is, for example, 10 to 20 nm. Next, an anisotropic etching process is performed to the conductive film, so that the mask pattern (pattern) MP2 made of this conductive film is formed on a side surface of the mask pattern MP1 and on the semiconductor substrate SUB in each of the regions A1 to A3. In this process, the insulating film IF2 functions as an etching stopper film.

Figure 12:
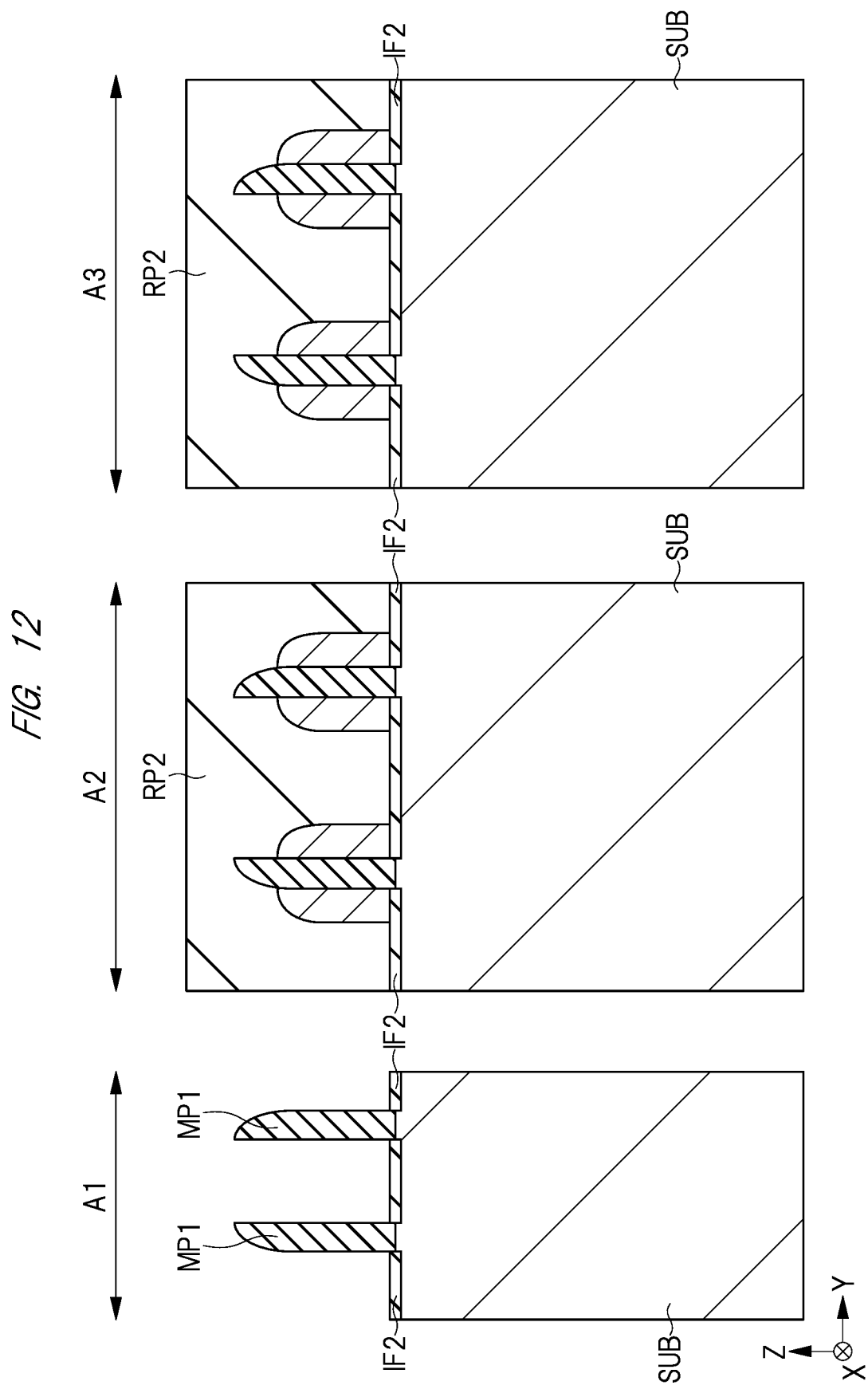
FIG. 12 is a cross-sectional view showing the method of manufacturing the semiconductor device, continued from FIG. 11.

FIG. 12 shows a step of removing a part of the mask pattern MP2.

First, a resist pattern RP2 that covers the regions A2 and A3 and that makes an opening of the region A1 is formed. Next, an isotropic etching process is performed while using the resist pattern RP2 as a mask, so that the mask pattern MP2 in the region A1 is selectively removed. Then, the resist pattern RP2 is removed by an ashing process or others.

In this state, the width of each mask pattern MP1 of the regions A1 to A3 is, for example, 10 to 20 nm, and the width of the mask pattern MP2 of the region A2 or A3 is, for example, 10 to 20 nm. That is, in the region A2 or A3, a total width of the mask pattern MP1 and the mask pattern MP2 is, for example, 30 to 60 nm.

Figure 13:
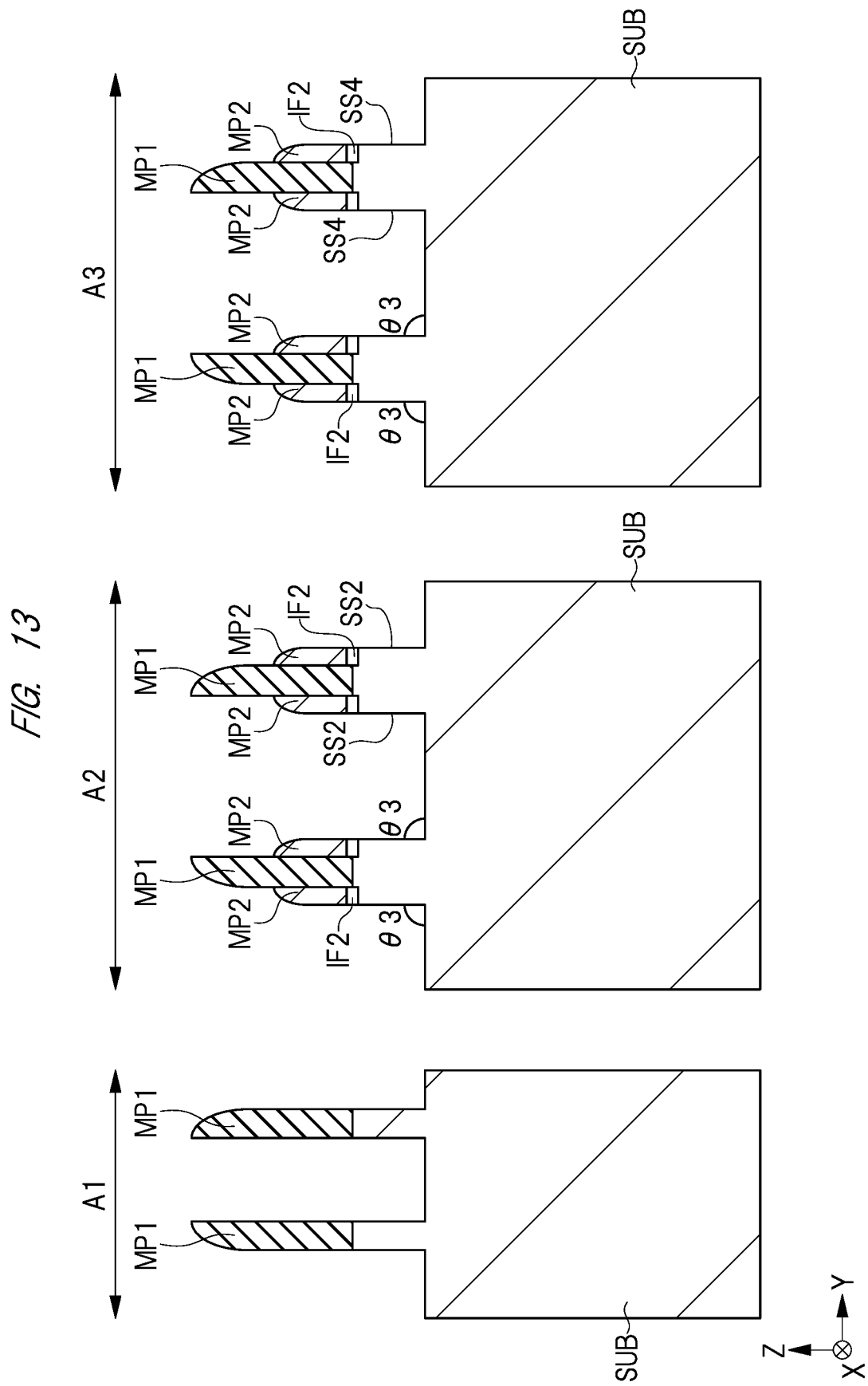
FIG. 13 is a cross-sectional view showing the method of manufacturing the semiconductor device, continued from FIG. 12.
Figure 14:
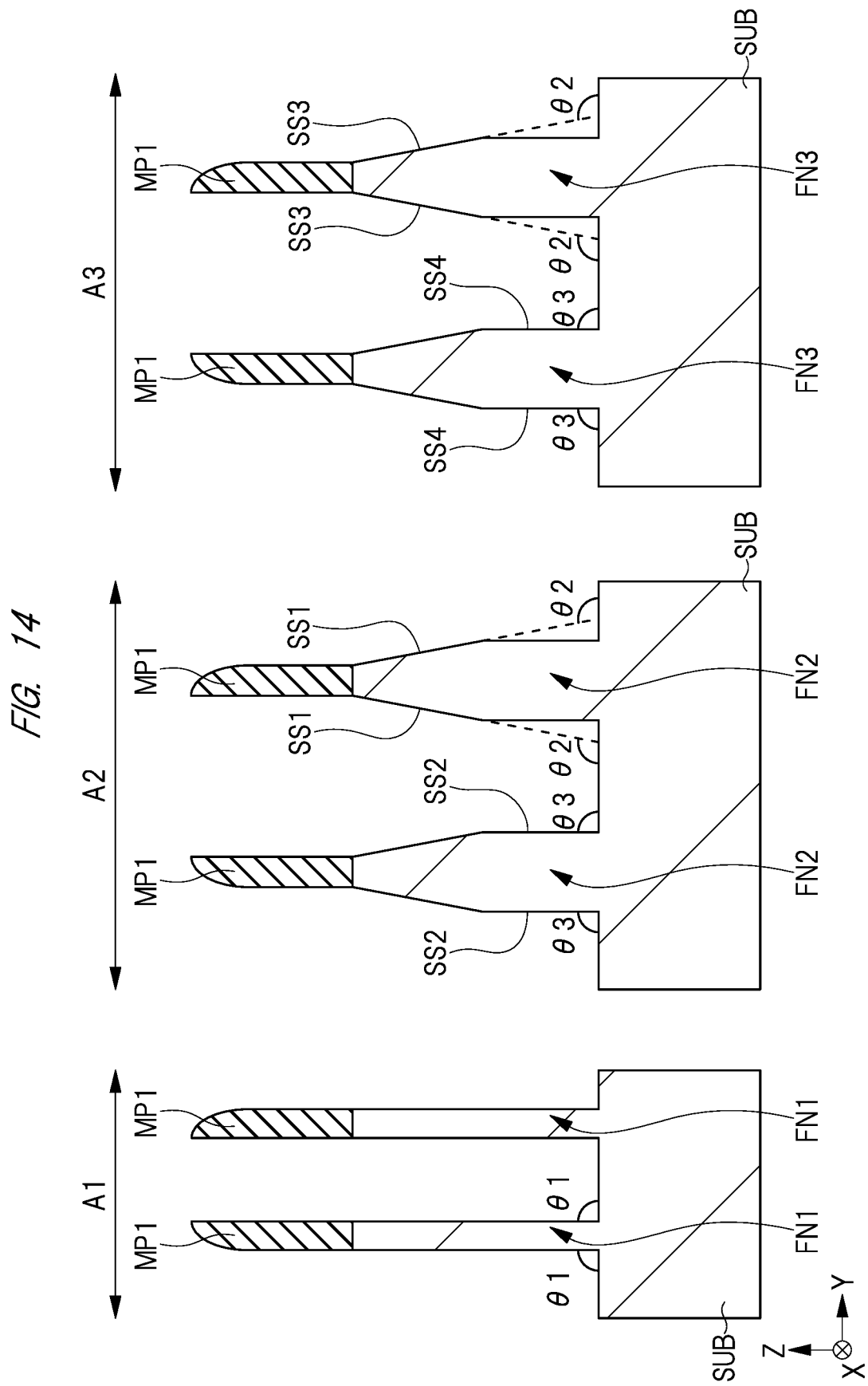
FIG. 14 is a cross-sectional view showing the method of manufacturing the semiconductor device, continued from FIG. 13.

Each of FIGS. 13 and 14 shows a step of forming the fins FN1 to FN3.

an anisotropic etching process is performed to the semiconductor substrate SUB in a state in which the mask pattern MP1 is left on the semiconductor substrate SUB in the region A1 while the mask pattern MP1 and the mask pattern MP2 are left on the semiconductor substrate SUB in each of the region A2 and the region A3.

This anisotropic etching process is performed under a condition making the semiconductor substrate SUB made of silicon and the mask pattern MP2 more susceptible to etching and making the mask pattern MP1 made of silicon oxide less susceptible to the etching. That is, an etching rate of the mask pattern MP1 and etching rates of the semiconductor substrate SUB and the mask pattern MP2 are different from each other.

In such anisotropic etching process, HBr (hydrogen bromide) gas is used, and mix gas containing, for example, HBr gas, $CHF_3$ (trifluoro methane) gas and $O_2$ (oxygen) gas is used.

The insulating film IF2 on the semiconductor substrate SUB is exposed to this anisotropic etching process prior to the semiconductor substrate SUB. Since the thickness of the insulating film IF2 is small, the insulating film IF2 is removed by this anisotropic etching process even without the change of the etching condition. Then, the semiconductor substrate SUB is etched.

Alternatively, an isotropic etching process using solution containing hydrofluoric acid may be performed immediately before this anisotropic etching process, so that the insulating film IF2 is removed to expose the semiconductor substrate SUB to outside.

In the middle of this anisotropic etching process, along with the etching on the semiconductor substrate SUB, the mask pattern MP2 is also etched at almost the same etching rate. Therefore, the more the etching goes, the smaller the height of the mask pattern MP2 in the Z direction is. The semiconductor substrate SUB is vertically etched until a vertical portion of the side surface of the mask pattern MP2 is removed, and therefore, the second surface SS2 and the fourth surface SS4 making the angle θ3 with respect to the upper surface of the semiconductor substrate SUB are formed.

Then, this anisotropic etching process is continued. The more the removal of the mask pattern MP2 is, the smaller a horizontal width of the mask pattern MP2 is, and therefore, the semiconductor substrate SUB is processed to have a taper shape. Note that the mask pattern MP2 is completely removed in the middle of this anisotropic etching process.

In a state after the removal of the mask pattern MP2, the semiconductor substrate SUB in each of the regions A1 to A3 is etched while using the mask pattern MP1 as a mask. Therefore, as shown in FIG. 14, the second surface SS2 and the fourth surface SS4 making the angle θ3 with respect to the recessed upper surface of the semiconductor substrate SUB are formed in the regions A2 and A3. And, the first surface SS1 and the third surface SS3 making the angle θ2 with respect to the recessed upper surface of the semiconductor substrate SUB are formed above the second surface SS2 and the fourth surface SS4. That is, the fin FN2 having the first surface SS1 and the second surface SS2 is formed in the region A2, and the fin FN3 having the third surface SS3 and the fourth surface SS4 is formed in the region A3.

In the region A1, the fin FN1 having a side surface making the angle θ1 with respect to the etched upper surface of the semiconductor substrate SUB is formed since only the mask pattern MP1 is used.

This process etches the semiconductor substrate SUB by 100 to 250 nm, and therefore, the height from the recessed upper surface of the semiconductor substrate SUB to each upper surface of the fins FN1 to FN3 is 100 to 250 nm.

As described above, the fins FN1 to FN3 having the features explained with reference to FIG. 6 are formed. Since the structures of the fins FN1 to FN3 of the regions A1 to A3 are different from one another, the reliabilities of the low-voltage MISFET, the high-voltage MISFET and the non-volatile memory cell can be secured, and thus, the suitable properties can be obtained.

That is, since each upper portion of the fins FN2 and FN3 has the taper shape, the problem of easily causing the electric field concentration on the regions A2 and A3, which results in the decrease in the breakdown voltage, can be suppressed. And, since each of the width W2 of the fin FN2 and the width W3 of the fin FN3 is larger than the width W1 of the fin FN1, it is difficult to cause the punch through phenomenon between the source region and the drain region in the high-voltage MISFET and the non-volatile memory cell driven by the high voltage. Therefore, the reliability of the semiconductor device can be improved.

Figure 15:
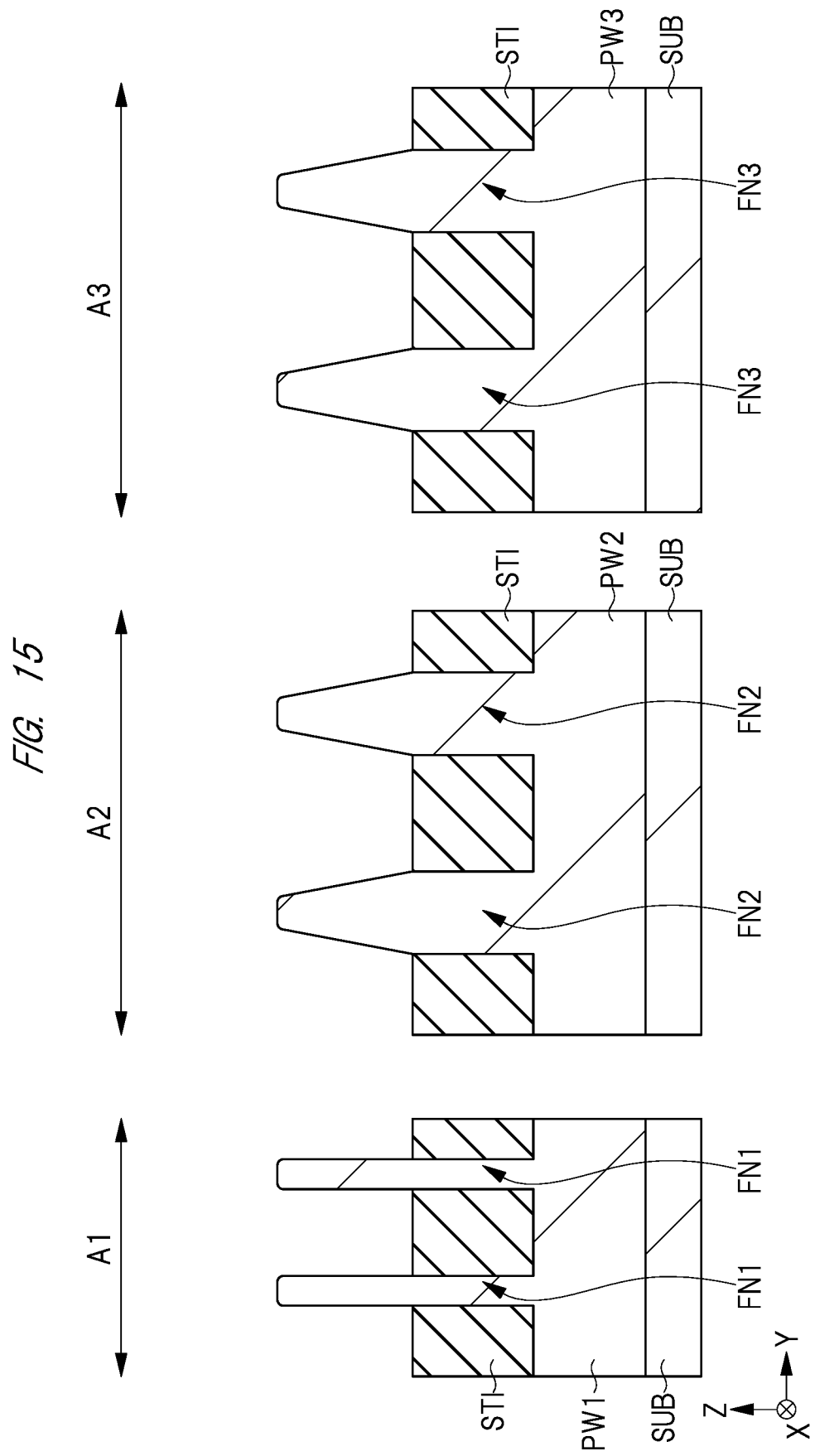
FIG. 15 is a cross-sectional view showing the method of manufacturing the semiconductor device, continued from FIG. 14.

FIG. 15 shows a step of forming the element isolation portion STI and the well regions PW1 to PW3.

First, on the semiconductor substrate SUB, an insulating film made of, for example, $O_3$-TEOS that is one type of a silicon oxide film is formed by, for example, a CVD method so as to fill a gap between the fins FN1 to FN3 and cover the mask pattern MP1. Next, while using the fins FN1 to FN3 below the mask pattern MP1 as an etching stopper, a polishing process is performed by a CMP (Chemical Mechanical Polishing) method. In this process, a part of the insulating film and the mask pattern MP1 are removed, so that the upper surfaces of the FN1 to FN3 are exposed to outside.

Next, an anisotropic etching process is performed to the insulating film, so that the insulating film is recessed. In this process, each upper portion of the fins FN1 to FN3 protrudes from the recessed upper surface of the insulating film. And, the insulating film filling the gap between the fins FN1 to FN3 becomes the element isolation portion STI.

Next, by using a photolithography technique and an ion implantation method, impurities such as boron (B) or difluoro boron ($BF_2$) are doped into the semiconductor substrate SUB. Next, A thermal process is performed to the semiconductor substrate SUB, so that the impurities are diffused, and the p-type wells PW1 to PW3 are formed in the semiconductor substrate SUB including the fins FN1 to FN3. Note that an n-type well region is formed in other region not illustrated although explanation for the region is omitted here.

Figure 16:
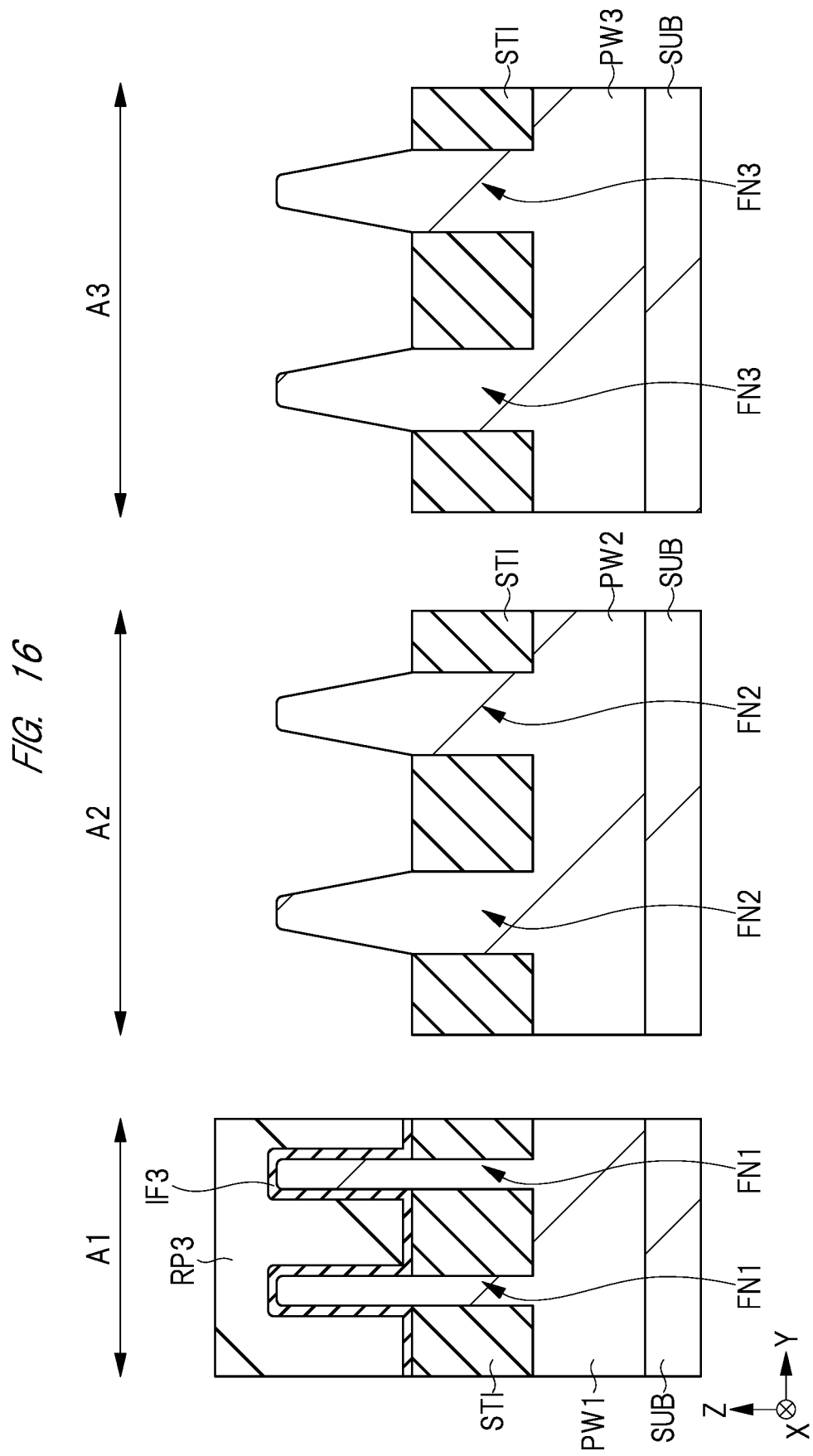
FIG. 16 is a cross-sectional view showing the method of manufacturing the semiconductor device, continued from FIG. 15.

FIG. 16 shows a step of forming an insulating film IF3.

First, on the element isolation portion STI, the insulating film IF3 made of, for example, a silicon nitride film is formed by, for example, a CVD method so as to cover the upper and side surfaces of each of the fins FN1 to FN3. A thickness of the insulating film IF3 is, for example, 5 to 10 nm. Next, a resist pattern RP3 that covers the region A1 and that makes each opening of the regions A2 and A3 is formed. Next, the insulating film IF3 of each of the regions A2 and A3 is removed by using solution containing phosphoric acid. Then, the resist pattern RP3 is removed by an ashing process or others.

Figure 17:
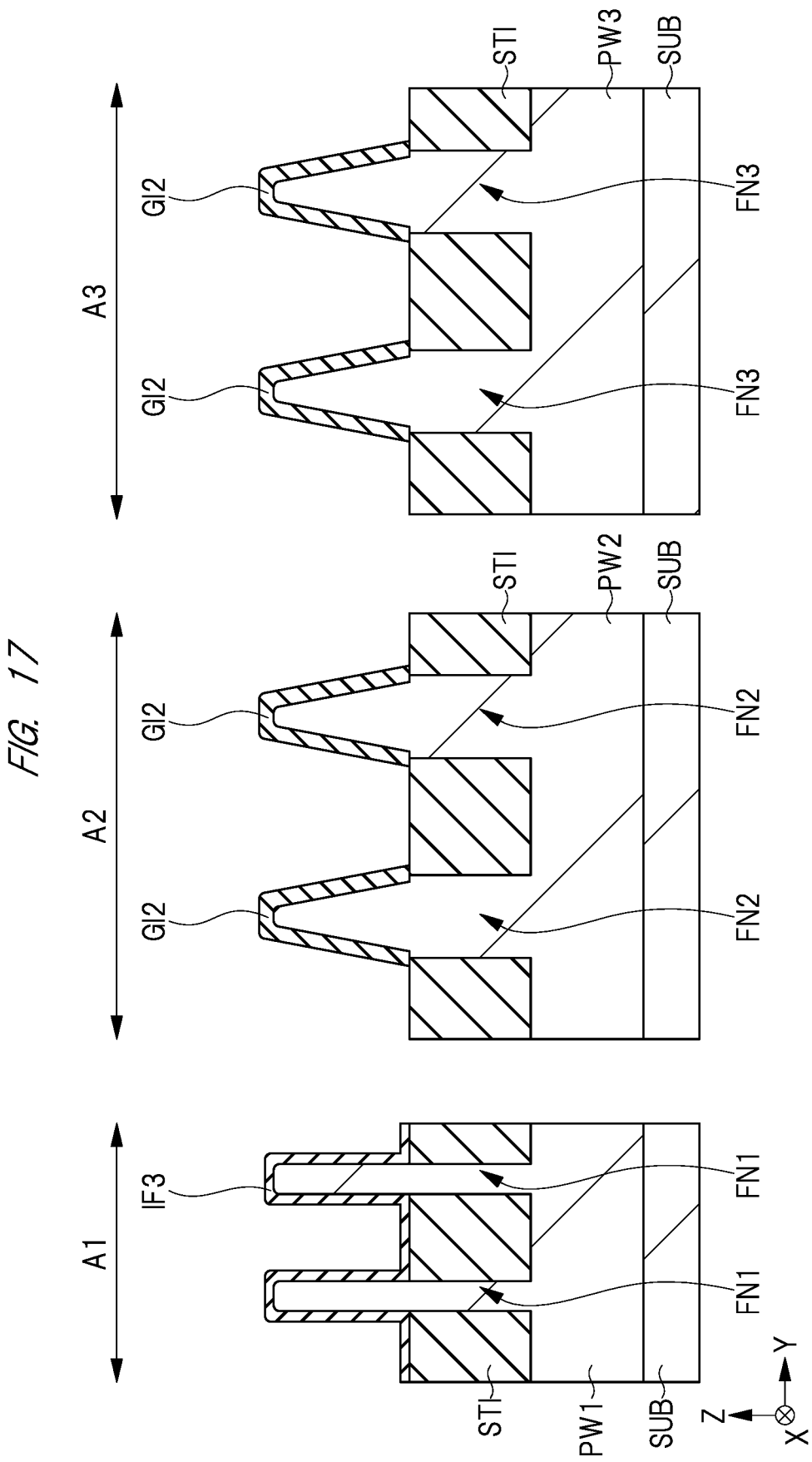
FIG. 17 is a cross-sectional view showing the method of manufacturing the semiconductor device, continued from FIG. 16.

FIG. 17 shows a step of forming a gate insulating film GI2.

In a state in which the upper and side surfaces of the fin FN1 are covered with the insulating film IF3, the gate insulating film GI2 made of, for example, a silicon oxide film is formed on the upper and side surfaces of each of the fins FN2 and FN3 by, for example, a thermal oxidation method. A thickness of the gate insulating film GI2 is, for example, 10 to 15 nm.

At this time, oxidation of the region A1 is suppressed by the insulating film IF3. Therefore, it is difficult to cause the problem of the thinned or the lost upper portion of the fin FN1 as described above in the first study example (FIG. 3). Thus, the performance of the semiconductor device can be improved.

Figure 18:
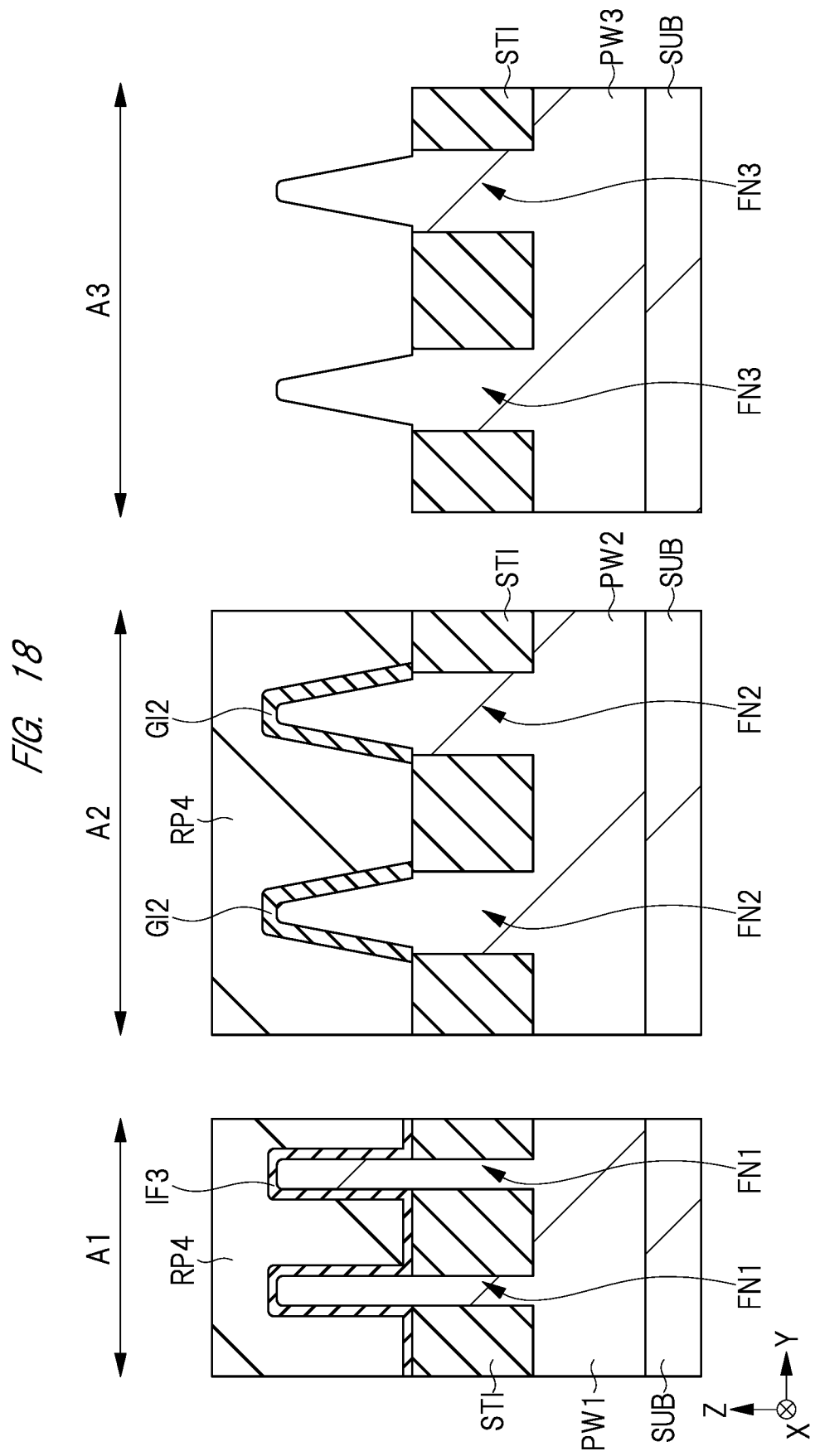
FIG. 18 is a cross-sectional view showing the method of manufacturing the semiconductor device, continued from FIG. 17.

FIG. 18 shows a step of removing the gate insulating film GI2.

First, a resist pattern RP4 that covers the regions A1 and A2 and that makes an opening of the region A3 is formed. Next, the gate insulating film GI2 is removed by an isotropic etching process. Then, the resist pattern RP4 is removed by an ashing process or others.

Figure 19:
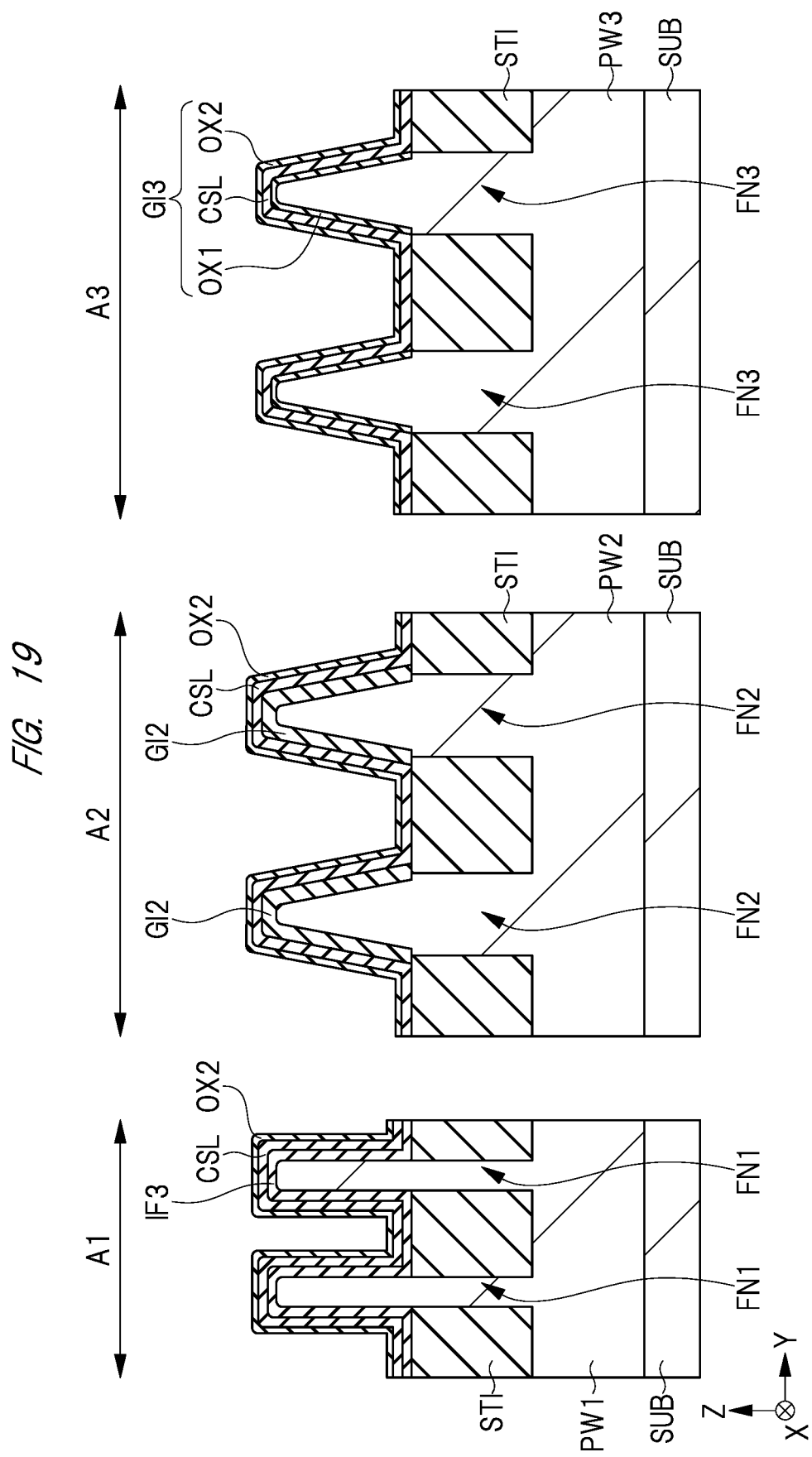
FIG. 19 is a cross-sectional view showing the method of manufacturing the semiconductor device, continued from FIG. 18.

FIG. 19 shows a step of forming a gate insulating film GI3 including an electric-charge accumulating layer CSL.

The gate insulating film GI3 is made of a layered film having an insulating film OX1, the electric-charge accumulating layer CSL and an insulating film OX2 layered.

First, the insulating film OX1 made of, for example, a silicon oxide film is formed on the upper and side surfaces of the fin FN3 by, for example, a thermal oxidation method or an ISSG (In-Situ Steam Generation) oxidation method. A thickness of the insulating film OX1 is, for example, 4 to 6 nm. Next, on the insulating film OX1, the electric-charge accumulating layer CSL is formed by, for example, a CVD method or an ALD (Atomic Layer Deposition) method. The electric-charge accumulating layer CSL is an insulating film such as a silicon nitride film having a trap level capable of accumulating the electric charge, and has a thickness of, for example, 6 to 10 nm. Next, on the electric-charge accumulating layer CSL, the insulating film OX2 made of, for example, a silicon oxide film is formed by, for example, a CVD method or an ISSG oxidation method. A thickness of the insulating film OX2 is, for example, 6 to 8 nm.

At this time, the insulating film OX2 and the electric-charge accumulating layer CSL that are parts of the gate insulating film GI3 are also formed on the insulating film IF3 in the region A1 and on the gate insulating film GI2 in the region A2.

If the insulating film IF3 is not formed on the upper and side surfaces of the fin FN1 in the region A1, the upper and side surfaces of the film FN1 are also oxidized in the step of forming the insulating film OX1. If so, there is the same problem as that of the above-described first study example (FIG. 3). However, in the first embodiment, such a problem is suppressed by the insulating film IF3.

Figure 20:
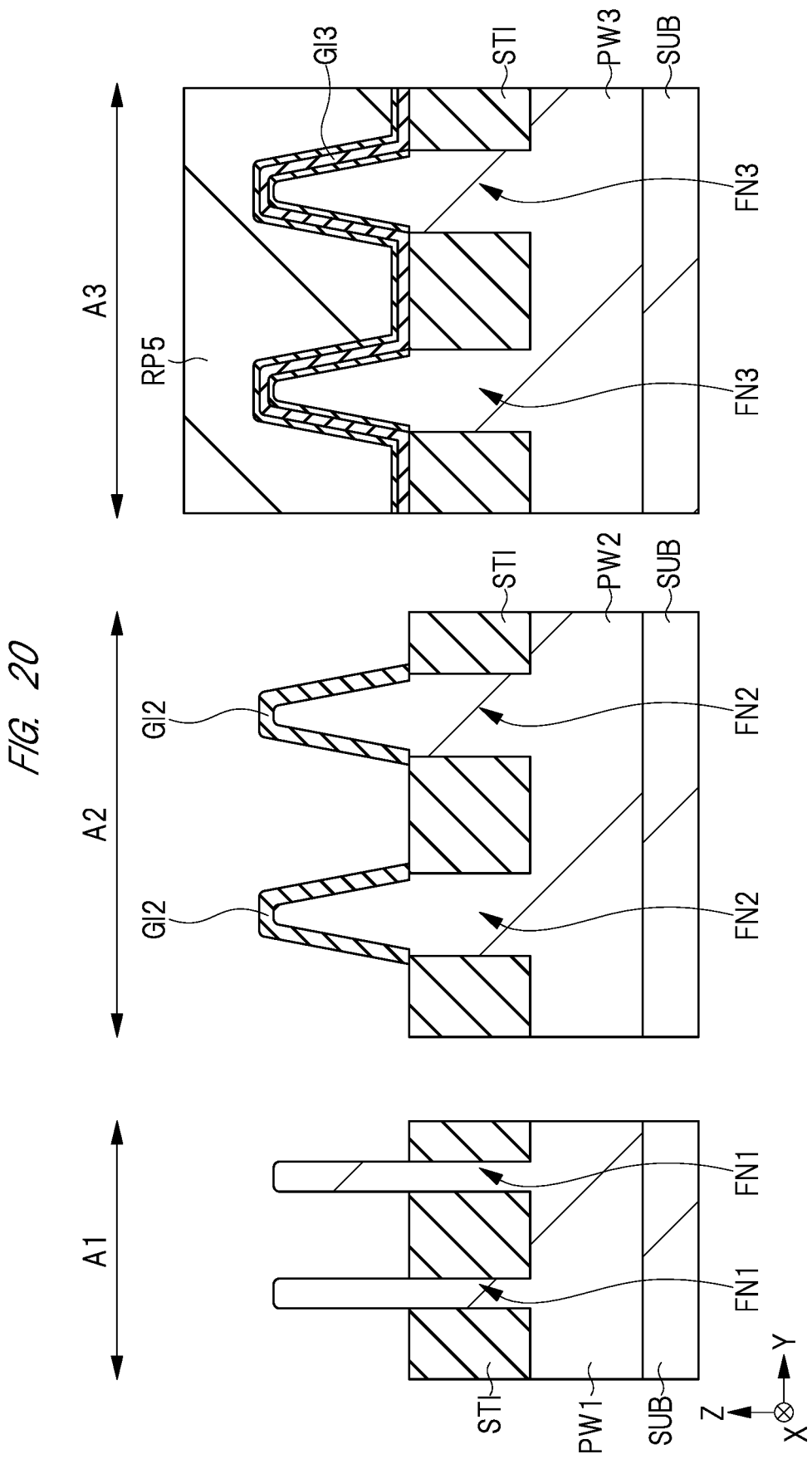
FIG. 20 is a cross-sectional view showing the method of manufacturing the semiconductor device, continued from FIG. 19.

FIG. 20 shows a step of removing the gate insulating film GI3 (the insulating film OX2 and the electric-charge accumulating layer CSL) and the insulating film IF3.

First, a resist pattern RP5 that covers the region A3 and that makes each opening of the regions A1 and A2 is formed. Next, the insulating film OX2 of each of the regions A1 and A2 is removed by using solution containing hydrofluoric acid.

Next, the electric-charge accumulating layer CSL of the region A1 and the insulating film IF3 and the electric-charge accumulating layer CSL of the region A2 are removed by using solution containing phosphoric acid, so that the upper and side surfaces of the fin FN1 are exposed to outside. In this step, an etching rate of the gate insulating film GI2 of the region A2 against the solution containing phosphoric acid is low, and therefore, the gate insulating film GI2 is not removed but left. Then, the resist pattern RP5 is removed by an ashing process or others.

Figure 21:
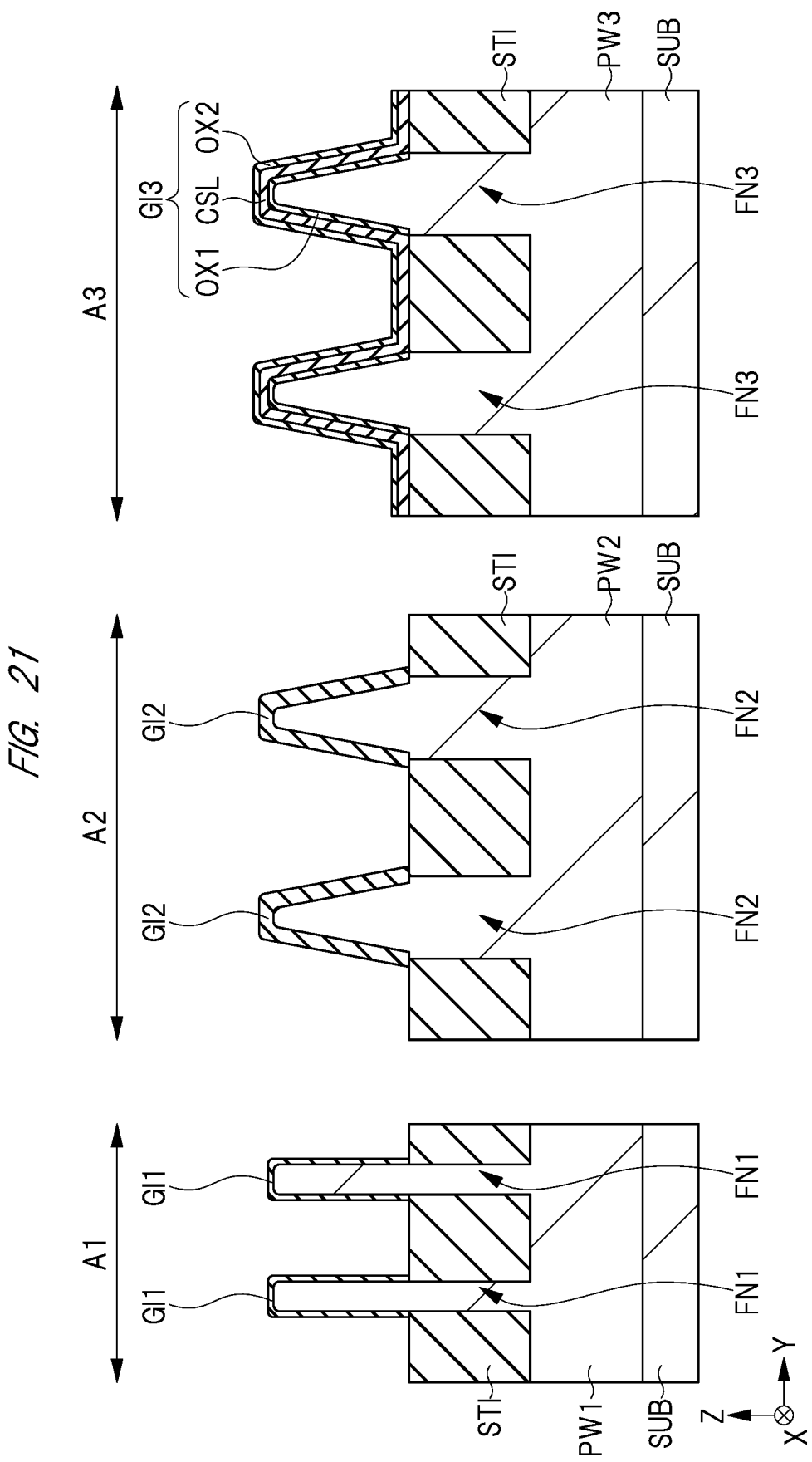
FIG. 21 is a cross-sectional view showing the method of manufacturing the semiconductor device, continued from FIG. 20.

FIG. 21 shows a step of forming the gate insulating film GI1.

The gate insulating film GI1 made of, for example, a silicon oxide film is formed on the upper and side surfaces of the fin FN1 by a thermal oxidation method or an ISSG oxidation method. A thickness of the gate insulating film GI1 is, for example, 1 to 3 nm. In this process, the fins FN2 and FN3 are also exposed to oxidation atmosphere, and therefore, thicknesses of the gate insulating film GI2 and the insulating film OX2 slightly increase in some cases.

Alternatively, as the gate insulating film GI1, a metal oxide film having a higher permittivity than that of a silicon nitride film may be used. As such a metal oxide film, for example, an alumina film (AlO film), a hafnium oxide film (HfO$_2$ film), a hafnium silicate film (HfSiO film), a hafnium nitride silicate film (HfSiON film), a zirconium oxide film (ZrO$_2$ film), a tantalum oxide film (Ta$_2$O$_5$ film), a lanthanum oxide film (La$_2$O$_3$ film), a zirconium oxynitride silicate film (ZrSiON film) and an aluminum nitride film (AlN film) are exemplified.

Figure 22:
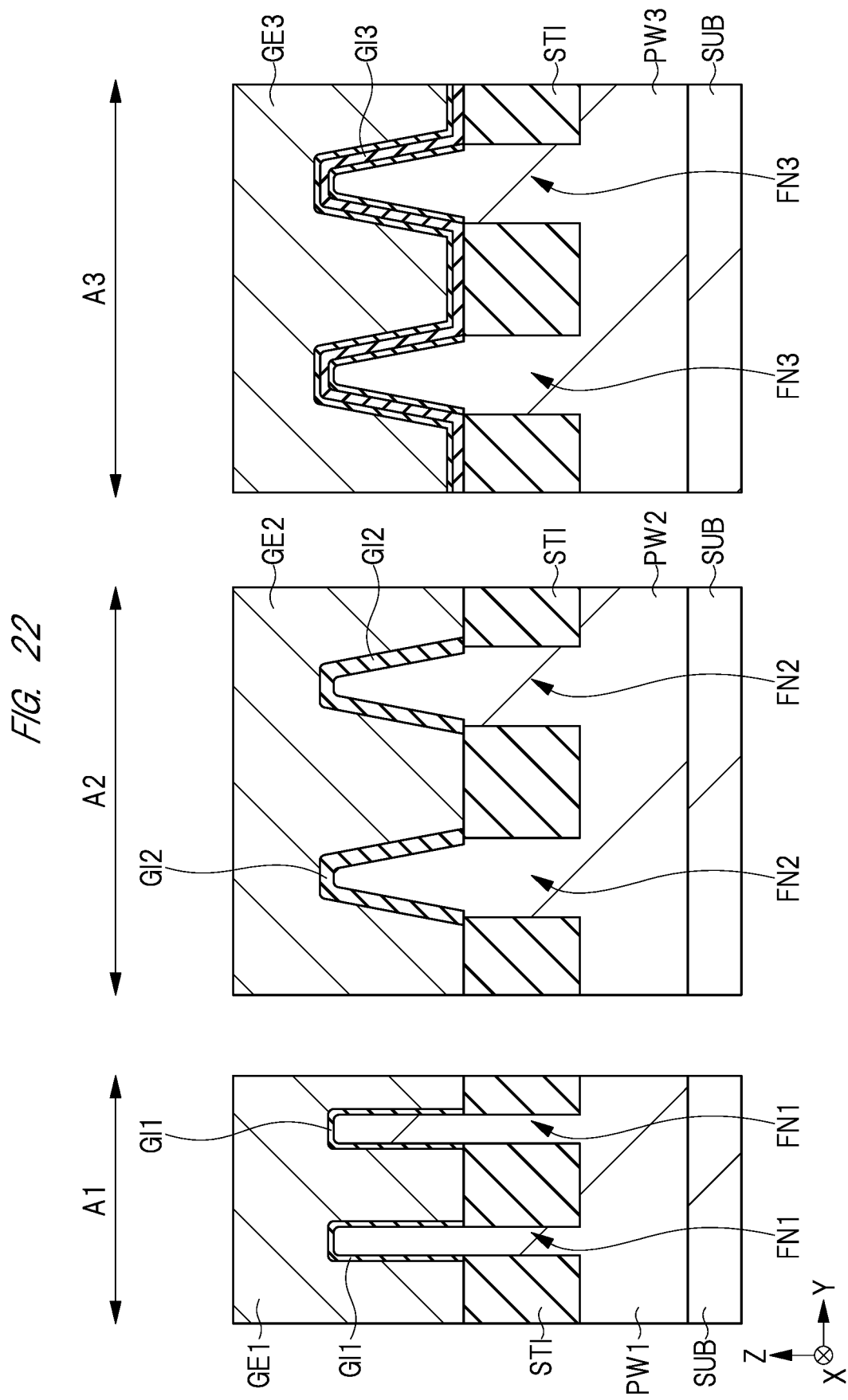
FIG. 22 is a cross-sectional view showing the method of manufacturing the semiconductor device, continued from FIG. 21.
Figure 23:
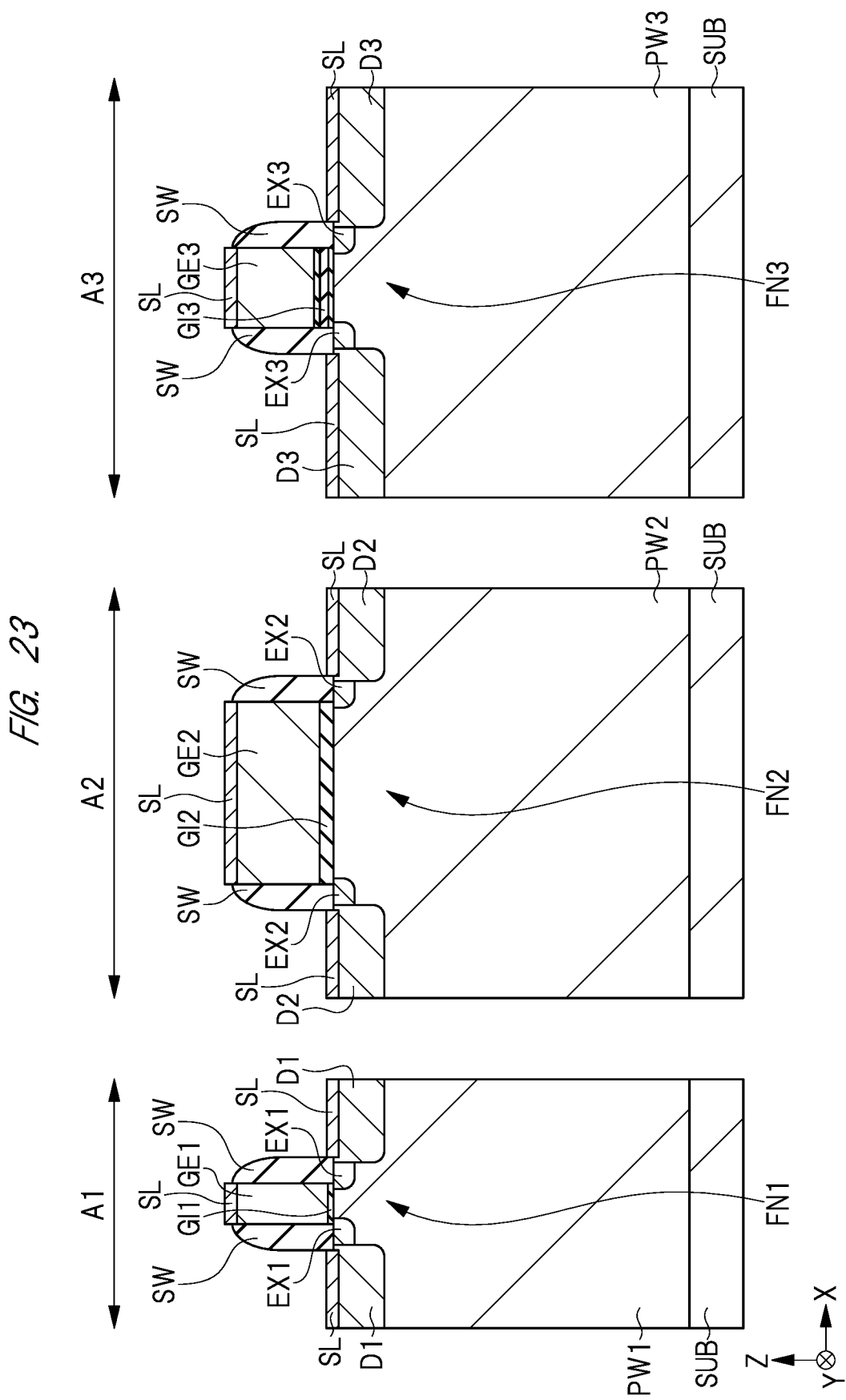
FIG. 23 is a cross-sectional view showing the method of manufacturing the semiconductor device, continued from FIG. 22, the cross-sectional view being in a different direction from FIGS. 7 to 22.

FIG. 22 shows a step of forming gate electrodes GE1 to GE3.

First, a conductive film made of, for example, a polycrystal silicon film is formed on the gate insulating film GI1 of the region A1, on the gate insulating film GI2 of the region A2 and on the gate insulating film GI3 of the region A3 by, for example, a CVD method. Next, the conductive film is selectively patterned by a photolithography technique and an anisotropic etching process. In this manner, the gate electrodes GE1 to GE3 each made of the conductive film are formed.

In the regions A1 to A3, the gate electrodes GE1 to GE3 are formed on the upper and side surfaces of the fins FN1 to FN3 so as to intervene the gate insulating films GI1 to GI3 therebetween, respectively.

After that, through various manufacturing steps, the low-voltage MISFET is formed in the region A1, the high-voltage MISFET is formed in the region A2, and the non-volatile memory cell is formed in the region A3.

With respect to FIG. 23, the various manufacturing steps will be explained. Note that FIG. 23 is cross-sectional views of the low-voltage MISFET, the high-voltage MISFET and the non-volatile memory cell in the gate-length direction, and shows a state of the upper surface of each of the fins FN1 to FN3.

After the step of forming the gate electrodes GE1 to GE3 in FIG. 22, for example, arsenic (As) or phosphorus (P) is doped into the fins FN1 to FN3 by a photolithography technique and an ion implantation method, so that n-type extension regions EX1 to E3 are formed in the fins FN1 to FN3, respectively.

Next, on each of the fins FN1 to FN3, an insulating film made of, for example, a silicon oxide film or a silicon nitride film is formed so as to cover the gate electrodes GE1 to GE3 by, for example, a CVD method. Next, an anisotropic etching process is performed to this insulating film, so that a sidewall spacer SW made of this insulating film is formed on each side surface of the gate electrodes GE1 to GE3. Note that the sidewall spacer SW may be made of a layered film of a silicon oxide film and a silicon nitride film.

Next, for example, arsenic (As) or phosphorus (P) is doped into the fins FN1 to FN3 by a photolithography technique and an ion implantation method, so that n-type diffusion regions D1 to D3 are formed on the fins FN1 to FN3, respectively. An impurity concentration of each of the diffusion regions D1 to D3 is higher than that of each of the extension regions EX1 to EX3. Each of the diffusion regions D1 to D3 and the extension regions EX1 to EX3 configures the source region or the drain region of the low-voltage MISFET, the high-voltage MISFET and the non-volatile memory cell.

Next, a low-resistance silicide layer SL is formed on each of the gate electrodes GE1 to GE3 and the diffusion regions D1 to D3 by a salicide (Self Aligned Silicide) technique. The silicide layer SL is made of, for example, cobalt silicide (CoSi$_2$), nickel silicide (NiSi) or nickel platinum silicide (NiPtSi).

In the above-described processes, the low-voltage MISFET, the high-voltage MISFET and the non-volatile memory cell included in the semiconductor device according to the first embodiment are manufactured.

Then, an interlayer insulating film, a plug connected to the silicide layer SL, a multilayered wiring layer electrically connected the plug and others are formed above the low-voltage MISFET, the high-voltage MISFET and the non-volatile memory cell. However, the explanation and illustration of them are omitted.

In the foregoing, the present invention has been concretely described on the basis of the embodiments. However, the present invention is not limited to the foregoing embodiments, and various modifications can be made within the scope of the present invention.

For example, in the above-described embodiments, the non-volatile memory cell operated by one gate electrode GE3 has been exemplified. However, the present invention is also applicable to a non-volatile memory cell including two gate electrodes such as a control gate electrode and a memory gate electrode that are formed so as to cover a channel region between the source region and the drain region.

What is claimed is:

1. A method of manufacturing a semiconductor device including a first region and a second region different from the first region, the method comprising:
   (a) preparing a semiconductor substrate;
   (b) forming a first pattern on the semiconductor substrate in each of the first region and the second region;
   (c) forming a second pattern made of a material that is different from a material configuring the first pattern, on a side surface of the first pattern and on the semiconductor substrate in each of the first region and the second region;
   (d) selectively removing the second pattern in the first region;
   (e) after the (d), forming a first fin in the first region and a second fin in the second region by a first anisotropic etching process performed to the semiconductor substrate in a state in which the first pattern is left on the semiconductor substrate in the first region while the first pattern and the second pattern are left on the semiconductor substrate in the second region;
   (f) after the (e), removing the first pattern in the first region and the first pattern in the second region;
   (g) after the (f), forming a first insulating film on an upper surface and a side surface of the first fin in the first region and on an upper surface and a side surface of the second fin in the second region;
   (h) after the (g), selectively removing the first insulating film in the second region; and
   (i) after the (h), forming a second gate insulating film on the upper surface and the side surface of the second fin in the second region in a state in which the first insulating film in the first region is left;
   (j) after the (i), removing the first insulating film in the first region; and
   (k) after the (j), forming a first gate insulating film having a thickness that is smaller than a thickness of the second gate insulating film, on the upper surface and the side surface of the first fin in the first region,
   wherein, in the middle of the €, the second pattern in the second region is removed, and wherein, in the (e), the first fin protrudes from an upper surface of the semiconductor substrate adjacent to the first fin, and the second fin protrudes from the upper surface of the semiconductor substrate adjacent to the second fin.

2. The method of manufacturing the semiconductor device according to claim 1,
wherein, in a planar view, the first fin extends in a first direction and has a first width in a second direction orthogonal to the first direction,
wherein, in a planar view, the second fin extends in a third direction and has a second width in a fourth direction orthogonal to the third direction, and
wherein the second width is larger than the first width.

3. The method of manufacturing the semiconductor device according to claim 2,
wherein the first width is an average width among respective widths at different height positions of the first fin, and
wherein the second width is an average width among respective widths at different height positions of the second fin.

4. The method of manufacturing the semiconductor device according to claim 2,
wherein the side surface of the first fin makes a first angle with respect to the upper surface of the semiconductor substrate adjacent to the first fin in the second direction,
wherein the side surface of the second fin has a first surface making a second angle with respect to the upper surface of the semiconductor substrate adjacent to the second fin in the fourth direction, and
wherein the second angle is larger than the first angle.

5. The method of manufacturing the semiconductor device according to claim 4,
wherein the side surface of the second fin further has a second surface being positioned to be lower than the first surface and making a third angle with respect to the upper surface of the semiconductor substrate adjacent to the second fin in the fourth direction, and
wherein the second angle is larger than the third angle.

6. The method of manufacturing the semiconductor device according to claim 1, wherein the first anisotropic etching process in the (e) is performed under a condition making the semiconductor substrate and the second pattern susceptible to etching and not making the first pattern susceptible to the etching.

7. The method of manufacturing the semiconductor device according to claim 6, wherein the (e) includes:
(e1) performing the first anisotropic etching process to the semiconductor substrate while using the first pattern as a mask in the first region and the first pattern and the second pattern as a mask in the second region; and
(e2) after the (e1), performing the first anisotropic etching process to the semiconductor substrate while using the first pattern as a mask in the first region and the second region in a state in which the second pattern is removed.

8. The method of manufacturing the semiconductor device according to claim 7,
wherein the side surface of the second fin has a second surface that is formed by the (e1) and the (e2), and a first surface that is formed by the (e2) and that is upper than the second surface, and
wherein a second angle made by the first surface and the upper surface of the semiconductor substrate adjacent to the second fin is larger than a third angle made by the second surface and the upper surface of the semiconductor substrate adjacent to the second fin.

9. The method of manufacturing the semiconductor device according to claim 7,
wherein each of a material configuring the semiconductor substrate and a material configuring the second pattern is silicon, and
wherein a material configuring the first pattern is silicon oxide.

10. The method of manufacturing the semiconductor device according to claim 9, wherein, in the first anisotropic etching process in the (e), mix gas containing HBr gas, $CHF_3$ gas and $O_2$ gas is used.

11. The method of manufacturing the semiconductor device according to claim 1, wherein, in the (i), the second gate insulating film is formed by a thermal oxidation method, and is made of silicon oxide.

12. The method of manufacturing the semiconductor device according to claim 11,
wherein the first region is a first MISFET formation region including the first gate insulating film, and
wherein the second region is a second MISFET formation region including the second gate insulating film and driven by a higher driving voltage than a driving voltage for the first MISFET.

13. The method of manufacturing the semiconductor device according to claim 1,
wherein the (i) further includes:
(i1) forming a second insulating film made of silicon oxide on the upper surface and the side surface of the second fin in the second region by a thermal oxidation method or an ISSG oxidation method;
(i2) forming an electric-charge accumulating layer on the second insulating film; and
(i3) forming a third insulating film on the electric-charge accumulating layer, and
wherein the second gate insulating film is made of a layered film including the second insulating film, the electric-charge accumulating layer and the third insulating film.

14. The method of manufacturing the semiconductor device according to claim 13,
wherein the first region is a first MISFET formation region including the first gate insulating film, and
wherein the second region is a non-volatile memory cell formation region including the second gate insulating film and using a higher rewriting voltage than a driving voltage for the first MISFET.

15. The method of manufacturing the semiconductor device according to claim 1, further comprising:
(l) after the (e), forming an element isolation portion on the upper surface of the semiconductor substrate adjacent to the first fin and the second fin,
wherein a position of an upper surface of the element isolation portion is lower than a position of the upper surface of the first fin and a position of the upper surface of the second fin,
wherein the first fin has a first head portion at the highest of the first fin and a first side portion positioned between the first head portion of the first fin and the upper surface of the semiconductor substrate,
wherein the upper surface of the first fin includes the first head portion,
wherein the side surface of the first fin includes the first side portion,
wherein the second fin has a second head portion at the highest of the second fin and a second side portion positioned between the second head portion of the second fin and the upper surface of the semiconductor substrate, wherein the upper surface of the second fin includes the second head portion, and wherein the side surface of the second fin includes the second side portion.

16. The method of manufacturing the semiconductor device according to claim 1, wherein the (b) further includes:
- (b1) forming a first conductive film on the semiconductor substrate;
- (b2) forming a mandrel on the semiconductor substrate in each of the first region and the second region by patterning the first conductive film;
- (b3) forming a fourth insulating film on the semiconductor substrate so as to cover the mandrel in the first region and the mandrel in the second region;
- (b4) forming the first pattern on a side surface of the mandrel in the first region and on a side surface of the mandrel in the second region by a second anisotropic etching process performed to the fourth insulating film; and
- (b5) after the (b4), removing the mandrel in the first region and the mandrel in the second region.

17. The method of manufacturing the semiconductor device according to claim 16, wherein the (c) further includes:
- (c1) forming a second conductive film on the semiconductor substrate so as to cover the first pattern in the first region and the first pattern in the second region; and
- (c2) forming the second pattern on the side surface of the first pattern in the first region and on the side surface of the first pattern in the second region by a third anisotropic etching process performed to the second conductive film.

* * * * *